(12) United States Patent
Kakehata et al.

(10) Patent No.: US 7,763,502 B2
(45) Date of Patent: Jul. 27, 2010

(54) SEMICONDUCTOR SUBSTRATE, METHOD FOR MANUFACTURING SEMICONDUCTOR SUBSTRATE, SEMICONDUCTOR DEVICE, AND ELECTRONIC DEVICE

(75) Inventors: Tetsuya Kakehata, Isehara (JP); Kazutaka Kuriki, Ebina (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 99 days.

(21) Appl. No.: 12/213,308

(22) Filed: Jun. 18, 2008

(65) Prior Publication Data
US 2008/0318394 A1 Dec. 25, 2008

(30) Foreign Application Priority Data
Jun. 22, 2007 (JP) ............................ 2007-165494

(51) Int. Cl.
*H01L 21/30* (2006.01)
(52) U.S. Cl. .................. 438/149; 438/151; 438/455; 438/458; 257/E21.211
(58) Field of Classification Search ......... 438/149–151, 438/455–458; 257/E21.211
See application file for complete search history.

(56) References Cited

U.S. PATENT DOCUMENTS

| | | | |
|---|---|---|---|
| 5,374,564 A | 12/1994 | Bruel | |
| 6,127,702 A | 10/2000 | Yamazaki et al. | |
| 6,271,101 B1 | 8/2001 | Fukunaga | |
| 6,335,231 B1 | 1/2002 | Yamazaki et al. | |
| 6,380,046 B1 | 4/2002 | Yamazaki | |
| 6,388,652 B1 | 5/2002 | Yamazaki et al. | |
| 6,534,380 B1 | 3/2003 | Yamauchi et al. | |
| 6,602,761 B2 | 8/2003 | Fukunaga | |
| 6,686,623 B2 | 2/2004 | Yamazaki | |
| 6,778,164 B2 | 8/2004 | Yamazaki et al. | |
| 6,803,264 B2 | 10/2004 | Yamazaki et al. | |
| 6,849,877 B2 * | 2/2005 | Yamazaki et al. ............. 257/86 |
| 6,875,633 B2 * | 4/2005 | Fukunaga ................... 438/107 |
| 7,176,525 B2 | 2/2007 | Fukunaga | |
| 7,199,024 B2 | 4/2007 | Yamazaki | |
| 7,241,666 B2 * | 7/2007 | Goto et al. .................. 438/455 |
| 7,256,776 B2 | 8/2007 | Yamazaki et al. | |
| 2004/0104424 A1 | 6/2004 | Yamazaki | |
| 2005/0009252 A1 | 1/2005 | Yamazaki et al. | |
| 2007/0108510 A1 | 5/2007 | Fukunaga | |
| 2007/0173000 A1 | 7/2007 | Yamazaki | |

(Continued)

FOREIGN PATENT DOCUMENTS

JP 11-163363 6/1999

*Primary Examiner*—Thanh Nguyen
(74) *Attorney, Agent, or Firm*—Eric J. Robinson; Robinson Intellectual Property Law Office, P.C.

(57) ABSTRACT

A single crystal semiconductor layer is formed over a substrate having an insulating surface by the following steps: forming an ion doped layer at a given depth from a surface of a single crystal semiconductor substrate; performing plasma treatment to the surface of the single crystal semiconductor substrate; forming an insulating layer on the single crystal semiconductor substrate to which the plasma treatment is performed; bonding the single crystal semiconductor substrate to the substrate having the insulating surface with an insulating layer interposed therebetween; and separating the single crystal semiconductor substrate using the ion doped layer as a separation surface. As a result, a semiconductor substrate in which a defect in an interface between the single crystal semiconductor layer and the insulating layer is reduced can be provided.

12 Claims, 16 Drawing Sheets

U.S. PATENT DOCUMENTS

2007/0184632 A1 8/2007 Yamazaki et al.
2007/0281440 A1 12/2007 Cites et al.
2007/0291022 A1 12/2007 Yamazaki et al.
2008/0268583 A1 10/2008 Yamazaki et al.
2008/0268615 A1 * 10/2008 Allibert et al. ............. 438/455
2008/0286939 A1 * 11/2008 Ohnuma ..................... 438/458

* cited by examiner

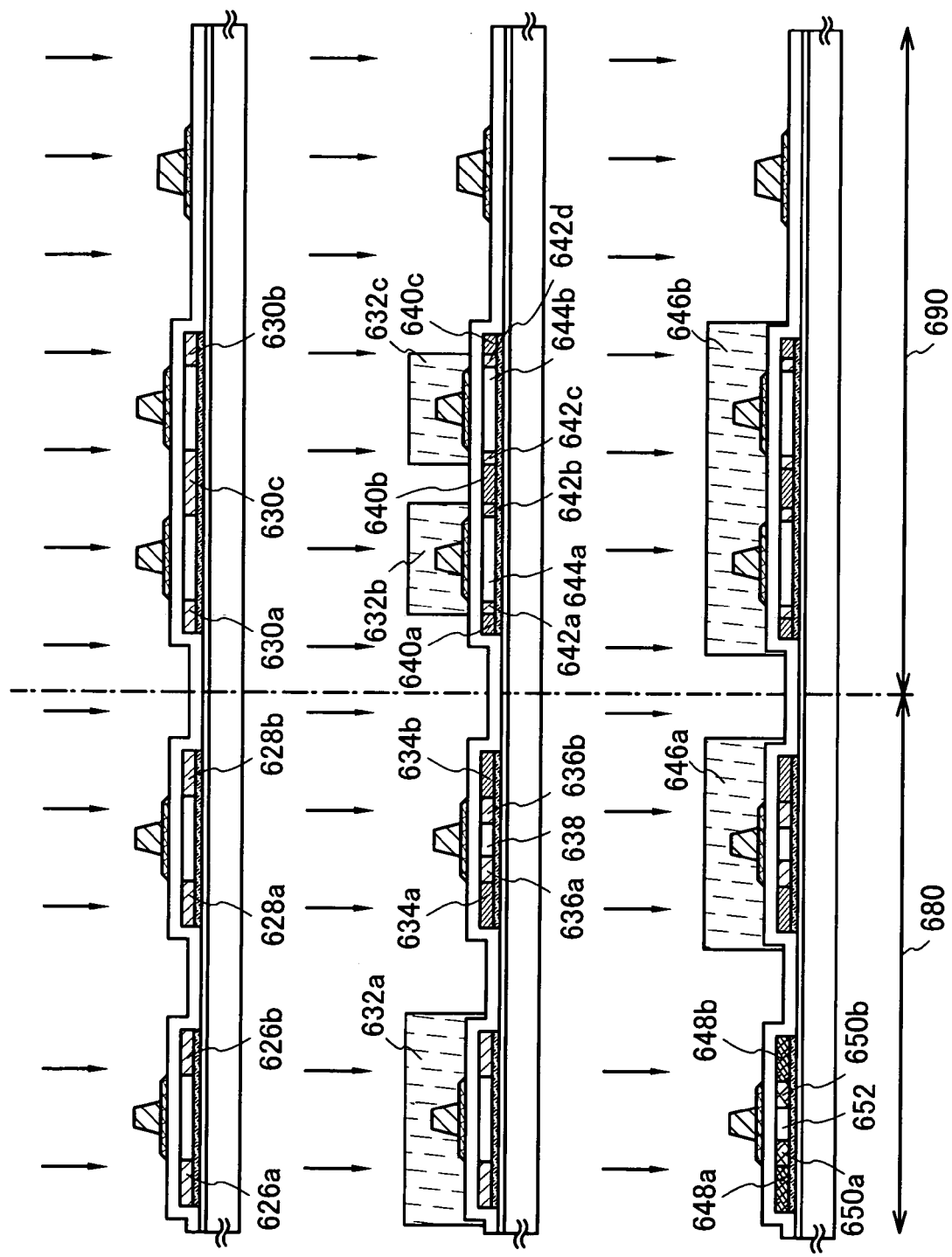

1400

1400

1400

1400

1400

1400

FIG. 16A
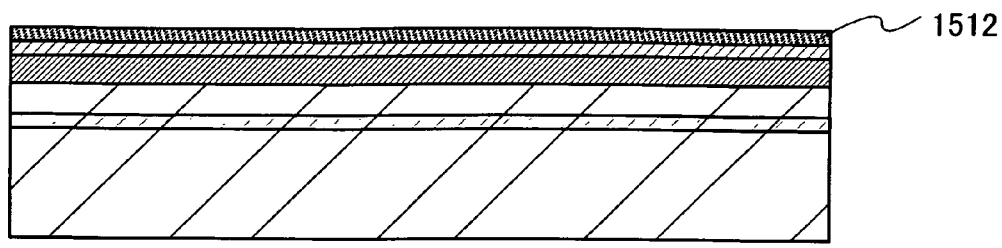
FIG. 16B
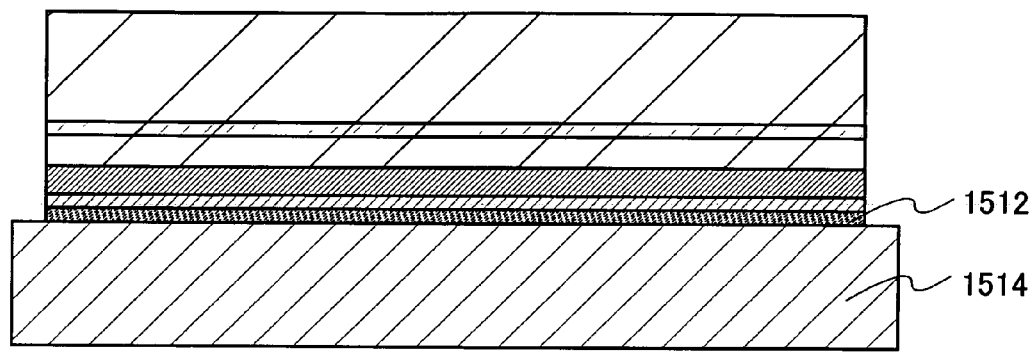
FIG. 16C
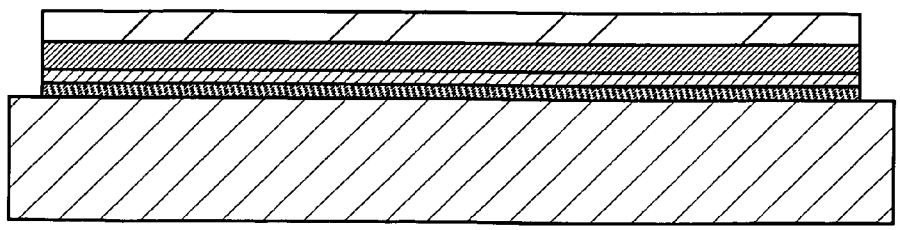

SEMICONDUCTOR SUBSTRATE, METHOD FOR MANUFACTURING SEMICONDUCTOR SUBSTRATE, SEMICONDUCTOR DEVICE, AND ELECTRONIC DEVICE

BACKGROUND OF THE INVENTION

1. Field of the Invention

The present invention relates to a semiconductor substrate, and a method for manufacturing a semiconductor substrate, a semiconductor device, and an electronic device.

2. Description of the Related Art

In recent years, an integrated circuit that uses an SOI (silicon on insulator) substrate replacing a silicon wafer formed by cutting an ingot of a single crystal semiconductor into thin slice, has been developed. An SOI substrate has a structure in which a thin single crystal silicon layer is provided on an insulating surface. By using this structure, a parasitic capacitance between a drain of a transistor and a substrate can be reduced and performance of a semiconductor integrated circuit can be improved.

There are various methods for manufacturing an SOI substrate; however, a Smart Cut (registered trademark) method is known for achieving both high quality and a high productivity (throughput) of a single crystal semiconductor layer to be formed. In the Smart Cut method, after introducing hydrogen ions into a single crystal silicon substrate (a bond wafer), the single crystal silicon substrate is bonded with another substrate (a base wafer) at a room temperature. Bonding is performed by forming strong joining by van der Waals force. After the bonding, the single crystal silicon substrate is separated with heat treatment at a temperature of about 500° C., in a region in which the hydrogen ions are introduced.

As a technical example of forming the single crystal silicon thin film using such a Smart Cut method, the one proposed by the present applicant can be noted (for example, see patent document 1; Published Patent Application Ser. No. 11-163, 363).

In the patent document 1, by forming an insulating film on a glass substrate, contamination of a single crystal silicon layer is prevented, and a high-performance semiconductor device is provided.

SUMMARY OF THE INVENTION

However, as for the problems when a single crystal silicon thin film is formed over a glass substrate by using a Smart Cut method, it is not limited to a problem of contaminant caused by the substrate. As an example, there is a problem due to damage with ion irradiation. However, since the Smart Cut method requires the ion irradiation, the problem due to the ion irradiation cannot be avoided.

In view of the above problems, it is an object of the present invention to provide a semiconductor substrate in which the problem due to the ion irradiation is solved and from which preferable characteristics can be obtained. In addition, it is another object of the present invention to provide semiconductor devices and electronic devices using the semiconductor substrate.

In the present invention, plasma treatment is performed to the surface of a single crystal semiconductor layer after ion irradiation. Accordingly, contaminant on the surface of the single crystal semiconductor layer can be removed and the minute surface can be formed. In other words, a defect in an interface between the single crystal semiconductor layer and an insulating layer to be formed later can be reduced.

A feature of a method for manufacturing a semiconductor substrate of the present invention is to include the following steps: forming a damaged region (also referred to as an ion implanted layer or an ion doped layer) at a given depth from a surface of a single crystal semiconductor substrate; performing plasma treatment to the surface of the single crystal semiconductor substrate; forming an insulating layer on the surface of the single crystal semiconductor substrate to which the plasma treatment is performed; bonding the single crystal semiconductor substrate and a substrate having an insulating surface with the insulating layer interposed therebetween; performing heat treatment to the single crystal semiconductor substrate to separate the single crystal semiconductor substrate in the damaged region and to form a single crystal semiconductor layer over the substrate having the insulating surface.

Another feature of a method for manufacturing a semiconductor substrate of the present invention is to include the following steps: forming a damaged region at a given depth from a surface of a single crystal semiconductor substrate; performing plasma treatment to the surface of the single crystal semiconductor substrate; forming an insulating layer on a substrate having an insulating surface; bonding the single crystal semiconductor substrate and the substrate having the insulating surface with the insulating layer interposed therebetween; performing heat treatment to the single crystal semiconductor substrate to separate the single crystal semiconductor substrate in the damaged region and to form a single crystal semiconductor layer over the substrate having the insulating surface.

In the above steps, the insulating layer may be formed by a chemical vapor deposition method using an organic silane gas. Further, a protective film may be formed before forming the damaged region, and the protective film may be removed after forming the damaged region.

Another feature of a method for manufacturing a semiconductor substrate of the present invention is to include the following steps: forming a damaged region at a given depth from a surface of a single crystal semiconductor substrate; performing plasma treatment to the surface of the single crystal semiconductor substrate; forming a first insulating layer on the surface of the single crystal semiconductor substrate to which the plasma treatment is performed; forming a second insulating layer in contact with the first insulating layer; bonding the single crystal semiconductor substrate and the first insulating layer, and a substrate having an insulating surface with the second insulating layer interposed therebetween; performing heat treatment to the single crystal semiconductor substrate to separate the single crystal semiconductor substrate in the damaged region and to form a single crystal semiconductor layer over the substrate having the insulating surface.

Another feature of a method for manufacturing a semiconductor substrate of the present invention is to include the following steps: forming a damaged region at a given depth from a surface of a single crystal semiconductor substrate; performing plasma treatment to the surface of the single crystal semiconductor substrate; forming a first insulating layer on the surface of the single crystal semiconductor substrate to which the plasma treatment is performed; forming a second insulating layer on a substrate having an insulating surface; bonding the single crystal semiconductor substrate and the first insulating layer, and the substrate having the insulating surface with the second insulating layer interposed therebetween; performing heat treatment to the single crystal semiconductor substrate to separate the single crystal semiconductor substrate in the damaged region and to form a single crystal semiconductor layer over the substrate having the insulating surface.

In the above steps, the first insulating layer may be formed to have a stacked-layer structure. Further, the first insulating layer may be formed to have a stacked-layer structure of a silicon onynitride layer and a silicon nitride oxide layer, and the silicon oxynitride layer may be formed to be in contact with the single crystal semiconductor substrate.

The second insulating layer may be formed by a chemical vapor deposition method using an organic silane gas. Further, a protective film may be formed before forming the damaged region, and the protective film may be removed after forming the damaged region.

In the above steps, the plasma treatment with an electron density of $1\times10^{11}$ cm$^{-3}$ to $1\times10^{13}$ cm$^{-3}$ and an electron temperature of 0.2 eV to 2.0 eV is preferably performed. Furthermore, the plasma treatment may be performed under a hydrogen ($H_2$) atmosphere, an oxygen ($O_2$) atmosphere, or a mixed atmosphere of hydrogen and oxygen.

A semiconductor substrate can be provided by the aforementioned manufacturing method.

By using the above semiconductor substrate, various semiconductor devices and electronic devices can be provided.

In this invention, the semiconductor devices include display devices such as a liquid crystal display device and an electroluminescence display device; wireless tags referred to as an RFID (Radio Frequency IDentification) tag, an RF tag, an RF chip, a radio processor, a radio memory, an IC (Integrated Circuit) tag, an IC label, an electronic tag, and an electronic chip; microprocessors such as a central processing unit (CPU); integrated circuits; and other general semiconductor devices in which a single crystal semiconductor layer formed by separating from a single crystal semiconductor substrate is used.

According to the present invention, a semiconductor substrate in which a defect in an interface between a single crystal semiconductor layer and an insulating layer is reduced can be provided. Furthermore, a semiconductor device and an electronic device with the use of the semiconductor substrate can be provided.

BRIEF DESCRIPTION OF THE DRAWINGS

FIGS. 7A to 7C are diagrams showing a manufacturing process of a semiconductor substrate in connection with an Embodiment Mode of the present invention;

FIGS. 16A to 16C are diagrams showing a manufacturing process of a semiconductor substrate in connection with an Embodiment of the present invention.

DETAILED DESCRIPTION OF THE INVENTION

Embodiment Mode

Figure 1A:
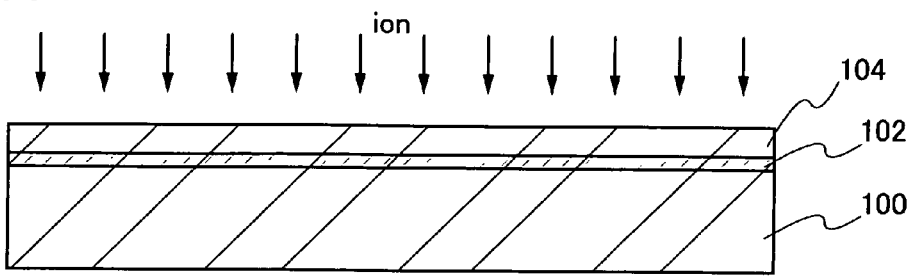
FIGS. 1A to 1E are diagrams showing a manufacturing process of a semiconductor substrate in connection with an Embodiment Mode of the present invention.

Embodiment Modes of the present invention are described hereinafter with reference to the drawings. Note that it will be easily understood by those skilled in the art that the present invention can be embodied in a wide variety of different ways and, therefore, various modifications and variations can be made to the present invention without departing from the spirit and scope thereof. Thus, the present invention should not be construed as being limited to the description in the following embodiment modes and example. Note that reference numerals denoting the identical portions are the same in all figures in the following description of the invention.

Embodiment Mode 1

In this embodiment mode, an example of a method for manufacturing a semiconductor device of the present invention is described with reference to FIGS. 1A to 3C.

First, a single crystal semiconductor substrate 100 is prepared. Then, a surface of the single crystal semiconductor substrate 100 is irradiated with ions to introduce the ions in a given depth from a top surface so that a damaged region 102 (also referred to as an ion implanted layer or an ion doped layer) and a single crystal semiconductor layer 104 are formed (see FIG. 1A). As a formation method of the damaged region 102, a method which is used when an impurity element is added to a semiconductor layer (an ion doping method), a method in which an ionized gas is mass-separated to irradiate a semiconductor layer selectively (an ion implantation method), or the like can be given. The irradiation with the ions may be conducted in consideration of the thickness of the single crystal semiconductor layer 104 which is to be formed. The thickness of the single crystal semiconductor layer 104 may be about 5 nm to 500 nm, preferably 10 nm to 200 nm. The acceleration voltage to irradiate with the ions can be determined in consideration of the above thickness.

The single crystal semiconductor substrate 100 is not particularly limited as long as the substrate is formed of a single crystal semiconductor material. As an example, a single crystal silicon substrate can be used. Besides, a substrate formed of a single crystal germanium, a compound semiconductor such as gallium arsenide or an indium phosphide, or the like can be used.

As the ions used for irradiation, ions of halogen typified by fluorine, hydrogen, helium and the like are given. In the case of irradiating with fluorine ions as halogen ions, $BF_3$ may be used as a material gas. For example, in the case of using a single crystal silicon substrate as the single crystal semiconductor substrate 100 and irradiating the single crystal silicon substrate with halogen ions such as fluorine ions, microvoids are formed in the damaged region 102. This is because silicon atoms in a silicon crystal lattice are purged by the halogen ions. By changing the volume of the thus formed microvoids, the single crystal silicon substrate can be separated. Specifically, the volumetric change of the microvoids is induced by heat treatment at a low temperature. Note that hydrogen may be included in the microvoids by irradiating with hydrogen ions after irradiating with fluorine ions.

Furthermore, a plurality of ions formed of the same atom with different mass number may be used for the irradiation. For example, in the case of irradiating with hydrogen ions, $H^+$, $H_2^+$ and $H_3^+$ are preferably included, and the ratio of the $H_3^+$ ions is preferably increased. By increasing the ratio of the $H_3^+$ ions, irradiation efficiency can be increased, and thus, irradiation time can be shortened.

Figure 1B:
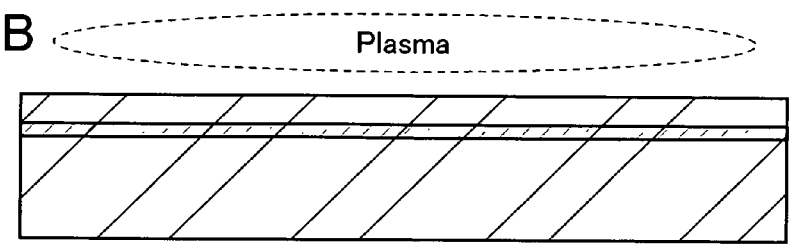

Next, plasma treatment is performed to the surface of the single crystal semiconductor layer 104 (see FIG. 1B). To be concrete, the plasma treatment is performed under a hydrogen ($H_2$) atmosphere, an oxygen ($O_2$) atmosphere, or a mixed atmosphere of oxygen and hydrogen, and, the surface of the single crystal semiconductor layer 104 is modified. By performing the plasma treatment under the hydrogen atmosphere, the surface is etched and contaminant can be removed. Furthermore, one part of the surface of the single crystal semiconductor layer 104 can be removed and an inner dense film can be exposed. Accordingly, dangling bonds in the single crystal semiconductor layer 104 can be terminated by hydrogen. Moreover, by performing the plasma treatment under the oxygen atmosphere, a dense oxygen film can be formed on the surface of the single crystal semiconductor layer 104. In other words, by performing the plasma treatment under these atmospheres, the interface between the single crystal semiconductor layer 104 and a bonding layer to be formed later can be kept clean and a defect can be reduced. An advantageous effect which is similar to that of this embodiment mode can be obtained even if a rare gas element is added to the above atmospheres.

Here, a case where the plasma treatment is not performed to the surface of the single crystal semiconductor layer 104 is considered. In the case where the plasma treatment is not performed to the single crystal semiconductor layer 104, a defect in an interface between the single crystal semiconductor layer 104 and the bonding layer exists; therefore, an interface state density is increased and a fixed charge is generated. An original characteristic of the single crystal semiconductor can not be obtained from a semiconductor element (for example, a transistor) formed using such a single crystal semiconductor layer 104. More specifically, various problems such as fluctuation in a threshold voltage, reduction in mobility, increase in subthreshold swing ($V_g$ which is necessary to increase $I_d$ by an order of magnitude in $I_d$-$V_g$ curve). The plasma treatment to the single crystal semiconductor layer 104 is extremely effective to solve these problems.

According to the present invention, the defect in the interface that is a source of the above-described problems can be reduced.

As a method for reducing the defect in the interface, there is a method of forming an oxide film by a thermal oxidation method. However, high temperature condition needed for thermal oxidation can not be applied to a Smart Cut method. In the Smart Cut method, separation of the single crystal semiconductor layer is conducted by heat treatment; however, temperature condition of the heat treatment is comparatively low at about 400° C. to 600° C. On the other hand, temperature condition needed for the thermal oxidation is 800° C. or higher, and in the case where such a high temperature process is employed in the Smart Cut method, separation of the single crystal semiconductor layer 104 is advanced. For the foregoing reasons, it is apparent that the plasma treatment is preferable to decrease the defects at the interface in the Smart Cut method.

As the plasma treatment, plasma treatment using a high frequency wave (such as a microwave) under the conditions of high density (preferably, in the range of $1 \times 10^{11}$ cm$^{-3}$ to $1 \times 10^{13}$ cm$^{-3}$) and a low electron temperature (preferably, in the range of 0.2 eV to 2.0 eV, more preferably, in the range of 0.5 eV to 1.5 eV) is preferably performed (the plasma treatment is hereinafter referred to as high-density plasma treatment). Such high density plasma treatment that features a low electron temperature has low kinetic energy of active species; therefore, damage due to plasma is less than the case of normal plasma treatment. Therefore, a more favorable interface as compared with the one formed by the normal plasma treatment can be formed. The high density plasma treatment is preferably performed in a mixed atmosphere of hydrogen and a rare gas (helium (He), neon (Ne), argon (Ar), krypton (Kr), xenon (Xe), and the like), or a mixed atmosphere of oxygen, hydrogen, and a rare gas.

In this embodiment mode, an example of performing the plasma treatment in the atmosphere containing at least hydrogen or oxide is described; however, the present invention is not limited to this. For example, the plasma treatment may be performed in an atmosphere containing nitrogen oxide ($NO_x$), ammonia ($NH_3$), nitrogen ($N_2$), or the like, or in a mixed atmosphere of any of these gases and hydrogen, oxygen, a rare gas, or the like.

Figure 2:
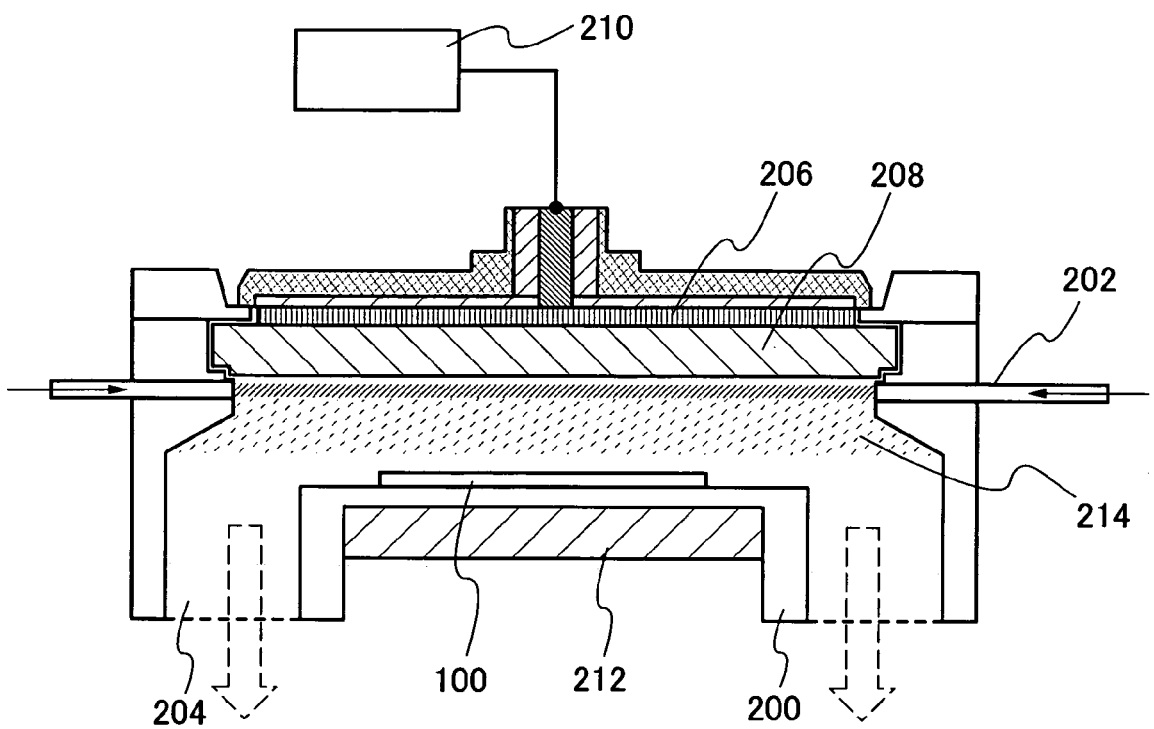
FIG. 2 is a diagram showing an apparatus used for manufacturing a semiconductor substrate in connection with an Embodiment Mode of the present invention.

FIG. 2 shows a structural example of an apparatus for performing plasma treatment. This plasma treatment apparatus in FIG. 2 includes a supporting base 200 for disposing the single crystal semiconductor substrate 100 to which plasma treatment is to be performed, a gas supplying portion 202 for introducing a gas, an exhaust outlet 204 connected to a vacuum pump for exhausting a gas, an antenna 206, a dielectric plate 208, and a microwave supplying portion 210 for supplying a microwave for generating plasma. In addition, by providing the supporting base 200 with a temperature controlling portion 212, the temperature of the single crystal semiconductor substrate 100 can be controlled.

Hereinafter, a procedure of the plasma treatment is described. First, a treatment chamber is evacuated, and a plasma treatment gas containing hydrogen or oxygen is introduced through the gas supplying portion 202. Note that the gas is not limited to this. The single crystal semiconductor substrate is set to have a temperature of about room temperature, or heated at a temperature of 100° C. to 400° C. by the temperature controlling portion 212. The distance between the single crystal semiconductor substrate 100 and the dielectric plate 208 (hereinafter also referred to as an "electrode distance") is about 10 mm to 80 mm (preferably, 20 mm to 60 mm).

Next, microwaves (for example, 2.45 GHz) are supplied to the antenna 206 from the microwave supplying portion 210. The microwaves are introduced into the treatment chamber through the dielectric plate 208, whereby plasma 214 is generated. By exciting plasma using the microwaves, plasma with a low electron temperature and a high electron density can be generated. In this embodiment mode, the case where the high-density plasma treatment is performed using the microwaves is described; however, the present invention is not limited hereto.

Figure 1C:
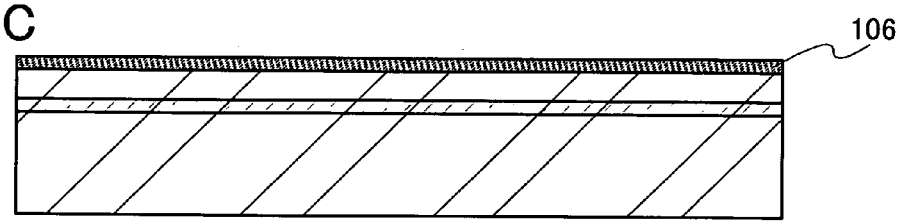

Subsequently, a bonding layer 106 is formed over the single crystal semiconductor layer 104 (see FIG. 1C). The bonding layer 106 is preferably formed of a silicon oxide film by a chemical vapor deposition method (CVD method) using an organic silane gas. Alternatively, the bonding layer 106 may be formed of a silicon oxide film by a CVD method using a silane gas. In the case where the CVD method is used, it is necessary to form a film under a temperature condition that a degasification of the damaged region 102 does not occur. When the single crystal semiconductor layer 104 is separated from the single crystal semiconductor substrate 100, the heat treatment is performed at a temperature higher than film-formation temperature. In addition, the bonding layer 106 is formed of an insulating material, and therefore, it can be also referred to as an insulating layer.

As the bonding layer 106, a silicon oxynitride film may be formed by an LPCVD method using $SiH_4$ and $NO_2$ as material gases. Accordingly, a preferable bonding layer 106 can be formed even under a low-temperature condition of 300° C. to 400° C. For example, a preferable bonding layer can be formed under the condition where the flow rate of $SiH_4$ is 40 sccm, the flow rate of $NO_2$ is 400 sccm, pressure is 266.6 Pa, and the temperature is 350° C.

The bonding layer 106 is formed to be smooth and has a hydrophilic surface. As the bonding layer 106, a silicon oxide film is suitable. Specifically, a silicon oxide film manufactured by a CVD method using an organic silane gas is preferably used. As the organic silane gas, a compound including silicon such as tetraethoxysilane (TEOS:$Si(OC_2H_5)_4$), trimethylsilane($(CH_3)_3$ SiH), Tetramethylcyclotetrasiloxane (TMCTS), octamethylcyclotetra siloxane (OMCTS), hexamethyldisilazane (HMDS), triethoxysilane ($SiH(OC_2H_5)_3$), and trisdimethylaminosilane ($SiH(N(CH_3)_2)_3$) can be used.

The bonding layer 106 is formed with a thickness of about 5 nm to 500 nm. With such a thickness, a surface on which a film to be formed can be smoothed and the smoothness of the growing surface of the film can be secured as well. In addition, distortion of a substrate to be bonded with the bonding layer 106 can be relieved. A substrate 110 having an insulating surface to be formed later may be provided with a similar bonding layer. As described, a strong bond can be formed when a silicon oxide film formed of organic silane as a material is provided over either one or both surfaces that are to form a bond.

Note that a structure in which an insulating layer including nitrogen may be provided between the single crystal semiconductor layer 104 and the bonding layer 106 may be employed. The insulating layer including nitrogen can be formed of one or more materials selected from silicon nitride, silicon nitride oxide, or silicon oxynitride. Note that the insulating layer including nitrogen has either a single layer structure or a stacked-layer structure. For example, the insulating layer including nitrogen may be formed by stacking a silicon oxynitride film and a silicon nitride oxide film from the side of the single crystal semiconductor layer 104. The insulating layer including nitrogen is provided so as to prevent an impurity of movable ions such as alkali metal and alkaline earth metal, moisture, and the like from entering the single crystal semiconductor layer 104. An insulating layer other than the insulating layer including nitrogen may be provided as long as it can prevent the impurity from entering.

Note that a silicon oxynitride means the one that contains more oxygen than nitrogen and includes, for example, oxygen, nitrogen, silicon, and hydrogen at concentrations ranging from greater than or equal to 50 atomic % and less than or equal to 70 atomic %, greater than or equal to 0.5 atomic % and less than or equal to 15 atomic %, greater than or equal to 25 atomic % and less than or equal to 35 atomic %, and greater than or equal to 0.1 atomic % and less than or equal to 10 atomic %, respectively. Further, a silicon nitride oxide means the one that contains more nitrogen than oxygen and includes, for example, oxygen, nitrogen, silicon, and hydrogen at concentrations ranging from greater than or equal to 5 atomic % and less than or equal to 30 atomic %, greater than or equal to 20 atomic % and less than or equal to 55 atomic %, greater than or equal to 25 atomic % and less than or equal to 35 atomic %, and greater than or equal to 10 atomic % and less than or equal to 25 atomic %, respectively. Note that the above ranges are the cases where measurements are performed using Rutherford backscattering spectrometry (RBS) and hydrogen forward scattering (HFS). The total of percentages of the constituent elements does not exceed 100 atomic %.

Figure 1D:
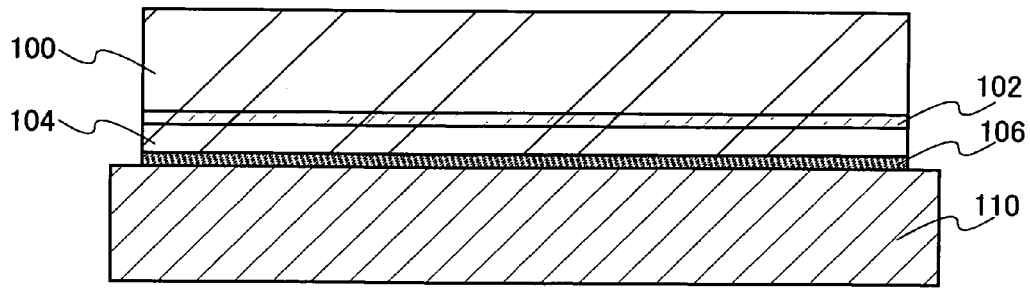

Then, the substrate 110 having the insulating surface is disposed in contact with the bonding layer 106 (see FIG. 1D). The substrate 110 having the insulating surface is disposed in contact with the bonding layer 106 and pressure is applied thereto, and therefore, a strong bond can be formed. Note that heat treatment is preferably performed after bonding the substrate 110 having the insulating surface and the single crystal semiconductor substrate 100 with the bonding layer 106 interposed therebetween. By performing the pressure treatment and the heat treatment, bonding strength can be improved.

In order to form a favorable bond, the surfaces which are to form a bond may be activated. For example, the surfaces which are to form the bond are irradiated with an atomic beam or an ion beam. In the case of using the atomic beam or the ion beam, an atomic beam of an inert gas such as argon or an ion beam of an inert gas can be used. Alternatively, plasma treatment or radical treatment may be performed. By such surface treatment, a bond between layers of different materials can be formed at a low temperature of about 200° C. to 400° C.

For the substrate 110 having the insulating surface, any of a variety of glass substrates which are used in the electronics industry such as an aluminosilicate glass substrate, an aluminoborosilicate glass substrate, and a barium borosilicate glass substrate; a quartz substrate; a ceramic substrate; a sapphire substrate; or the like can be used. A glass substrate is preferably used, and a mother glass substrate having a large area can be also used, such as a so-called sixth generation substrate (1500 mm×1850 mm), a so-called seventh generation substrate (1870 mm×2200 mm), and a so-called eighth generation substrate (2200 mm×2400 mm), for example. By using the mother glass substrate having the large area as the substrate 110 having the insulating surface, the area of the semiconductor substrate can be enlarged. However, the substrate 110 having the insulating surface is not limited to the above mentioned substrates. For example, a substrate formed of a resin material can also be used as long as the substrate has an allowable temperature limit.

Figure 1E:
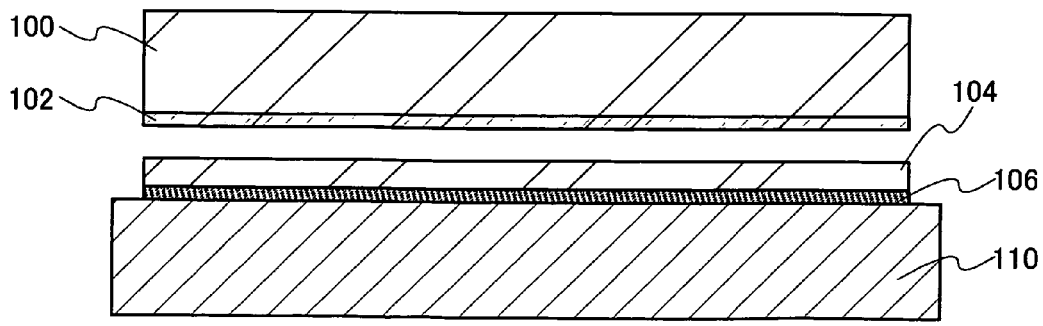

Subsequently, heat treatment is performed so as to separate the single crystal semiconductor layer 104 from the single crystal semiconductor substrate 100 using the damaged region 102 as a separation surface (see FIG. 1E). For example, by performing the heat treatment at a temperature of 400° C. to 600° C., volume change of microvoids formed in the damaged region 102 is induced and the single crystal semiconductor layer 104 is separated from the single crystal semiconductor substrate 100. Because the bonding layer 106 is bonded to the substrate 110 having the insulating surface, the single crystal semiconductor layer 104 having the same crystallinity as the single crystal semiconductor substrate 100 remains on the substrate 110 having the insulating surface.

In the case of using the glass substrate as the substrate 110 having the insulating surface, the heat treatment is performed at a temperature close to a strain point of the glass substrate, specifically at a temperature in a range of minus 50° C. to plus 50° C. of the strain point of the glass substrate, and more specifically, at a temperature in a range from 580° C. to 680° C. The glass substrate has a characteristic of shrinking when heated. Therefore, by heating the glass substrate at a temperature close to a strain point of the glass substrate, specifically at a temperature approximately in the range of minus 50° C. to plus 50° C. (or higher) of the strain point of the glass substrate, shrink of the glass substrate in later heat treatment can be suppressed. Thus, even when heat treatment is conducted to the glass substrate to which a single crystal semiconductor layer having a different coefficient of thermal expansion is bonded, film separation of the single crystal semiconductor layer from the glass substrate can be prevented. Moreover, deformation such as warping of the glass substrate and the single crystal semiconductor layer can be prevented.

In the case of using the glass substrate, after heating the glass substrate, it is preferable to avoid rapid cooling. Specifically, the glass substrate may be cooled down to a temperature equal to or lower than the strain point, preferably at a rate of 2° C./min or lower, more preferably at a rate of 0.5° C./min or lower, and further preferably at 0.3° C./min or lower. By setting the temperature reduction rate low, local stress generated when the glass substrate shrinks can be relieved. This heat treatment may be conducted under an atmospheric pressure or a reduced pressure, and the atmosphere may be properly set and may be a nitrogen atmosphere, an oxygen atmosphere, or the like. Note that the heat treatment is applicable to the substrate other than the glass substrate in the case where substrate has a characteristic of shrinking after being heated.

Note that the heat treatment in the bonding step and the heat treatment in the separating step can be performed at the same time. In this case, two steps can be performed in one heat treatment; and therefore, the number of manufacturing step can be reduced, so that the semiconductor substrate can be manufactured at low cost.

Note that the single crystal semiconductor layer 104 obtained by the aforementioned steps is preferably subjected to chemical mechanical polishing (CMP) in order to flatten the surface thereof. By improving flatness of the single crystal semiconductor layer 104, variation in the semiconductor elements that are to be formed later can be suppressed. Note that CMP may be omitted when a desired characteristic is obtained.

Moreover, by conducting another heat treatment or laser irradiation, the characteristic of the single crystal semiconductor layer 104 may be improved. The allowable temperature limit of the substrate 110 having the insulating surface is used as a measure of the heat treatment temperature. In the case of using a glass substrate as the substrate 110 having the insulating surface, a distortion point of the glass substrate is used as a measure of the heat treatment temperature. Specifically, the heat treatment is performed at a temperature approximately in a range from minus 50° C. to plus 50° C. of the distortion point of the glass substrate (more specifically, 580° C. to 680° C.).

For the laser irradiation, for example, a continuous wave laser (a CW laser), a quasi-continuous wave laser (a pulsed laser with a repetition rate of 10 MHz or more, preferably, 80 MHz or more), or the like can be used. Specifically, as the CW laser, an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti: sapphire laser, a helium cadmium laser, and the like can be used. As the quasi-CW laser, a pulsed laser such as an Ar laser, a Kr laser, an excimer laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti: sapphire laser, a copper vapor laser, and a gold vapor laser can be used. Such a pulsed laser can be treated in the same way as the continuous wave laser when the repetition rate is increased.

Figure 3A:
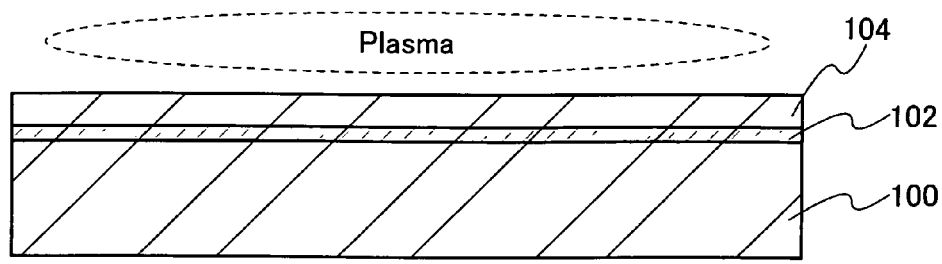
FIGS. 3A to 3C are diagrams showing a manufacturing process of a semiconductor substrate in connection with an Embodiment Mode of the present invention.

Then, a case where the bonding layer 106 is provided for the side of the substrate 110 having the insulating surface is described with reference to FIGS. 3A to 3C. Note that steps up to the plasma treatment shown in FIG. 1B are similar in FIGS. 3A to 3C; therefore, detailed explanation thereof is omitted.

Figure 3B:
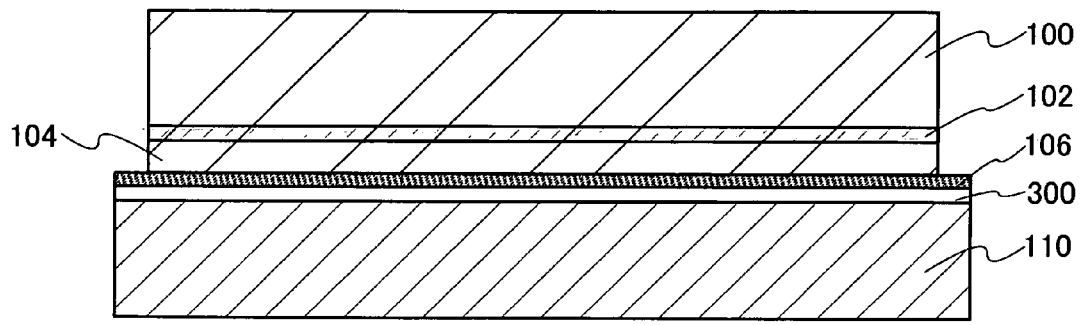

After performing the plasma treatment to the single crystal semiconductor layer 104 (see FIG. 3A), a substrate 110 having an insulating surface over which a barrier layer 300 and a bonding layer 106 are formed, is disposed in contact with the single crystal semiconductor substrate 100 (see FIG. 3B). Specifically, the bonding layer 106 and the single crystal semiconductor layer 104 to which the plasma treatment is performed are disposed in contact and bonded to each other. The barrier layer 300 is provided so as to prevent impurities such as alkali metal and alkaline earth metal from entering the single crystal semiconductor layer 104. The barrier layer 300 is not necessarily provided when intrusion of the impurities from the substrate 110 having the insulating surface into the single crystal semiconductor layer 104 does not cause any problems.

The barrier layer 300 can be formed of one or a plurality of materials selected from silicon oxide, silicon nitride, silicon nitride oxide, silicon oxynitride, and the like. The barrier layer 300 may have a single layer structure or a stacked layer structure. Note that the materials for forming the barrier layer 300 are not limited to the aforementioned materials, as long as the materials can prevent an impurity from entering. The barrier layer 300 is formed of an insulating material; therefore, it can also be referred to as an insulating layer.

Figure 3C:
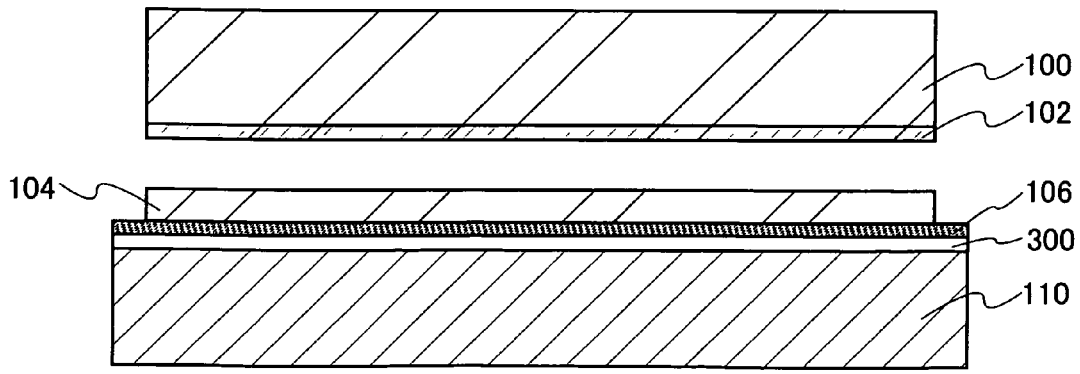

Thereafter the single crystal semiconductor substrate 100 is separated (see FIG. 3C). The heat treatment when the single crystal semiconductor substrate 100 is separated can be carried out similarly to that in the case of FIG. 1E; therefore, detailed description is omitted. Accordingly, a semiconductor substrate shown in FIG. 3C can be obtained.

It is preferable that the semiconductor substrate shown in FIG. 3C is also subjected to chemical mechanical polishing (CMP). By improving flatness of the single crystal semiconductor layer 104, variation of semiconductor elements to be formed later can be suppressed. Note that CMP may be omitted when a desired characteristic is obtained.

By conducting another heat treatment or laser irradiation, the characteristic of the single crystal semiconductor layer 104 may be improved. For the heat treatment temperature and a laser capable of being used, the above description can be referred to; therefore, description is omitted.

Accordingly, a semiconductor substrate in which a defect in an interface between the single crystal semiconductor layer 104 and the bonding layer 106 is reduced can be provided. Thus, a semiconductor device in which a characteristic of a semiconductor element to be formed later is drastically improved can be provided.

Embodiment Mode 2

In this embodiment mode, another example of a method for manufacturing a semiconductor device according to the present invention is described with reference to FIGS. 4A to 4C and FIGS. 5A to 5C. In this embodiment mode, a method for manufacturing a semiconductor device in which the defect shown in Embodiment Mode 1 can be repaired and damage of a single crystal semiconductor layer due to ion irradiation can be reduced is described.

Figure 4A:
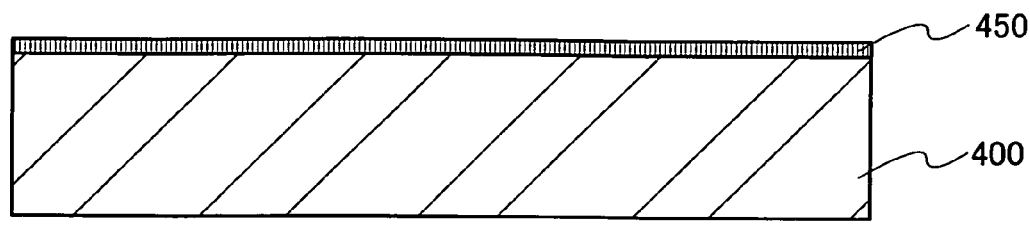
FIGS. 4A to 4C are diagrams showing a manufacturing process of a semiconductor substrate in connection with an Embodiment Mode of the present invention.

First, a protective layer 450 is formed over a single crystal semiconductor substrate 400 (see FIG. 4A). Any substrate can be used as the single crystal semiconductor substrate 400 as long as it is formed of a single crystal semiconductor material. As an example, a single crystal silicon substrate can be used. Besides, a substrate formed of a single crystal germanium, a compound semiconductor such as gallium arsenide, and indium phosphide, or the like can be used.

The protective layer 450 can be formed of one or a plurality of materials selected from silicon oxide, silicon nitride, silicon nitride oxide, silicon oxynitride, and the like. The protective layer 450 may have a single layer structure or a stacked layer structure. As the method for forming the protective layer 450, a chemical vapor deposition (CVD) method, a sputtering method, a thermal oxidation method, a thermal nitridation method, or the like is given. However, the method is not limited to this. It is preferable that the thickness of the protective layer 450 is approximately 50 nm to 200 nm. The protective layer 450 is formed of an insulating material; therefore, it can also be referred to as an insulating layer. By providing the protective layer 450, roughness of the surface of the single crystal semiconductor substrate 400 (the surface of the single crystal semiconductor layer to be formed later) caused by ion irradiation can be suppressed.

Figure 4B:
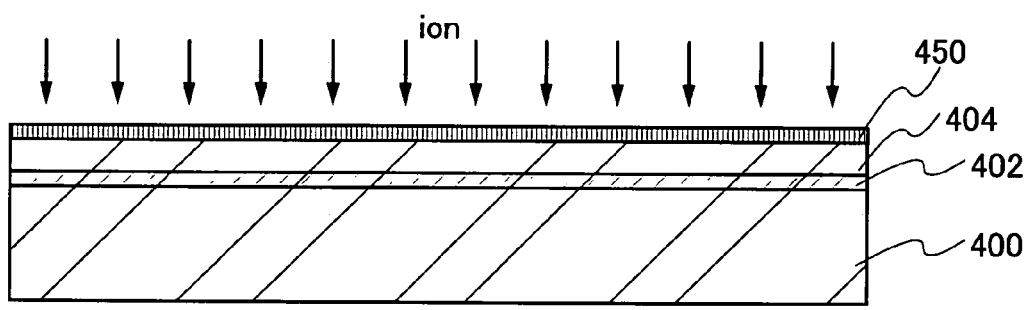

Then, the surface of the single crystal semiconductor substrate 400 is irradiated with ions through the protective layer 450 to introduce the ions in a given depth from the surface, thereby forming a damaged region 402 and a single crystal semiconductor layer 404 (see FIG. 4B). Embodiment Mode 1 can be referred to for the detail of the method for manufacturing the damaged region 402 and the single crystal semiconductor layer 404; therefore detailed description is omitted.

Figure 4C:
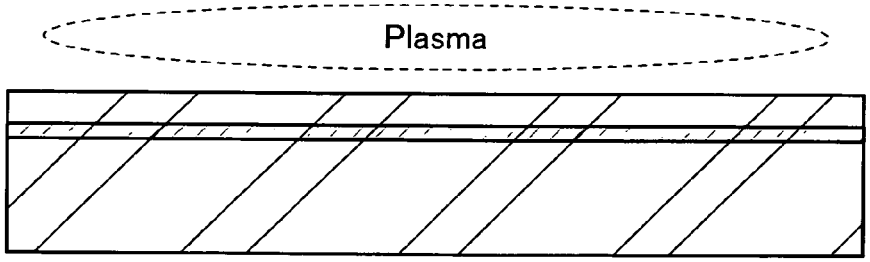

After forming the damaged region 402, the protective layer 450 is removed and plasma treatment is performed to the surface of the single crystal semiconductor layer 404 (see FIG. 4C). To be concrete, the plasma treatment is performed under a hydrogen ($H_2$) atmosphere, or a mixed atmosphere of oxygen ($O_2$) and hydrogen so as to modify the surface of the single crystal semiconductor layer 404. Accordingly, contaminant on the surface of the single crystal semiconductor layer 404 can be removed and a dense surface can be formed, and thus, a defect in the interface between the single crystal semiconductor layer 404 and a bonding layer to be formed later can be reduced. In this embodiment mode, damage to the surface of the single crystal semiconductor layer 404 due to ion irradiation is reduced by the protective layer 450. However, a certain defect remains. Therefore, by removing the protective layer 450 and performing plasma treatment to the single crystal semiconductor layer 404, defect can be further reduced.

In addition, the protective layer 450 itself is damaged by ion irradiation. In this embodiment mode, the protective layer 450 is not left and is removed entirely; therefore, a semiconductor substrate not using a deteriorated protective layer can be manufactured. By removing the deteriorated protective layer, the semiconductor substrate having further improved characteristics can be realized.

Embodiment Mode 1 can be referred to for the detail of the plasma treatment; therefore, description is omitted.

Figure 5A:
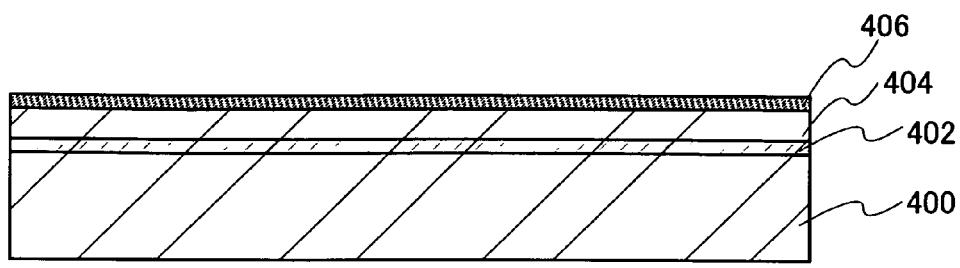
FIGS. 5A to 5C are diagrams showing a manufacturing process of a semiconductor substrate in connection with an Embodiment Mode of the present invention.

Subsequently, a bonding layer 406 is formed over the single crystal semiconductor layer 404 to which the plasma treatment is performed (see FIG. 5A). The bonding layer 406 is preferably formed of a silicon oxide film by chemical vapor deposition method (CVD method) using an organic silane gas. Alternatively, the bonding layer 406 may be formed of a silicon oxide film by a CVD method using a silane gas. In the case where the CVD method is used, it is necessary to form a film under a condition that a degasification of the damaged region 402 does not occur. When the single crystal semiconductor layer 404 is separated from the single crystal semiconductor substrate 400, heat treatment is performed at a temperature higher than film-formation temperature. In addition, the bonding layer 406 is formed of an insulating material; therefore, it can be also referred to as an insulating layer.

Embodiment Mode 1 can be referred to for the detail of the method for manufacturing the bonding layer 406; therefore, description is omitted.

Note that a structure in which an insulating layer including nitrogen may be provided between the single crystal semiconductor layer 404 and the bonding layer 406 may be employed. The insulating layer including nitrogen can be formed of one or more materials selected from silicon nitride, silicon nitride oxide, or silicon oxynitride. Note that the insulating layer including nitrogen has either a single layer structure or a stacked-layer structure. For example, the insulating layer including nitrogen may be formed by stacking a silicon oxynitride film and a silicon nitride oxide film from the side of the single crystal semiconductor layer 404. The insulating layer including nitrogen is provided so as to prevent an impurity of movable ions such as alkali metal and alkaline earth metal, moisture, and the like from entering the single crystal semiconductor layer 404. An insulating layer other than the insulating layer including nitrogen may be provided as long as it can prevent the impurity from entering.

Figure 5B:
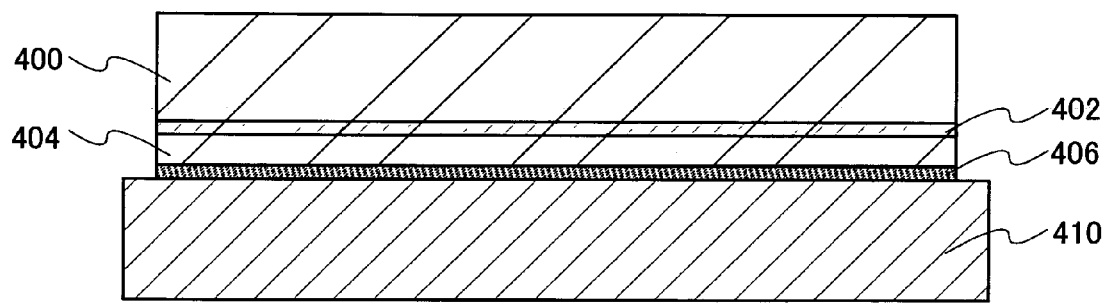

Then, a substrate 410 having an insulating surface is disposed in contact with the bonding layer 406 (see FIG. 5B). The substrate 410 having the insulating surface is disposed in contact with the bonding layer 406 and pressure is applied thereto, and therefore, a strong bond can be formed. Note that heat treatment is preferably performed after bonding the substrate 410 having the insulating surface and the single crystal semiconductor substrate 400 with the bonding layer 406 interposed therebetween. By performing the pressure treatment and the heat treatment, bonding strength can be improved.

In order to form a favorable bond, the surfaces which are to form a bond may be activated. For example, the surfaces which are to form the bond are irradiated with an atomic beam or an ion beam. In the case of using the atomic beam or the ion beam, an atomic beam of an inert gas such as argon or an ion beam of an inert gas can be used. Alternatively, plasma treatment or radical treatment may be performed. By such surface treatment, a bond between layers of different materials can be formed at a low temperature of about 200° C. to 400° C.

For the substrate 410 having the insulating surface, any of a variety of glass substrates which are used in the electronics industry such as an aluminosilicate glass substrate, an aluminoborosilicate glass substrate, and a barium borosilicate glass substrate; a quartz substrate; a ceramic substrate; a sapphire substrate; or the like can be used. A glass substrate is preferably used, and a mother glass substrate having a large area can be also used, such as a so-called sixth generation substrate (1500 mm×1850 mm), a so-called seventh generation substrate (1870 mm×2200 mm), and a so-called eighth generation substrate (2200 mm×2400 mm), for example. By using the mother glass substrate having the large area as the substrate 410 having the insulating surface, the area of the semiconductor substrate can be enlarged. However, the substrate 410 having the insulating surface is not limited to the above mentioned substrates. For example, a substrate formed of a resin material can also be used as long as the substrate has an allowable temperature limit.

Figure 5C:
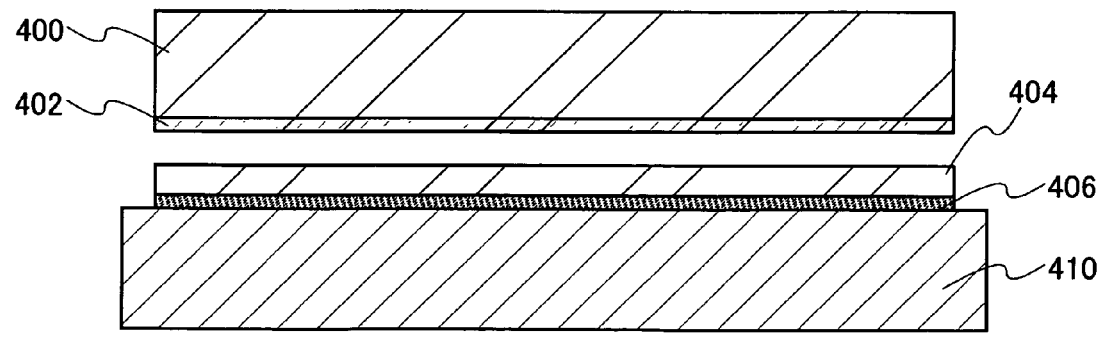

Subsequently, heat treatment is performed so as to separate the single crystal semiconductor layer 404 from the single crystal semiconductor substrate 400 using the damaged region 402 as a separation surface (see FIG. 5C). For example, by performing the heat treatment at a temperature of 400° C. to 600° C., volume change of microvoids formed in the damaged region 402 is induced and the single crystal semiconductor layer 404 is separated from the single crystal semiconductor substrate 400. Because the bonding layer 406 is bonded to the substrate 410 having the insulating surface, the single crystal semiconductor layer 404 having the same crystallinity as the single crystal semiconductor substrate 400 remains on the substrate 410 having the insulating surface.

Embodiment Mode 1 can be referred to for the detail of the heat treatment in a separation step. Note that the heat treatment in the bonding step and the heat treatment in the separating step can be performed at the same time. In this case, two steps can be performed in one heat treatment; and therefore, the number of manufacturing steps can be reduced, so that the semiconductor substrate can be manufactured at low cost.

Note that the single crystal semiconductor layer 404 obtained by the aforementioned steps is preferably subjected to chemical mechanical polishing (CMP) in order to flatten the surface thereof. By improving flatness of the single crystal semiconductor layer 404, variation in the semiconductor elements that are to be formed later can be suppressed. Note that CMP may be omitted when a desired characteristic is obtained.

Moreover, by conducting another heat treatment or laser irradiation, the characteristic of the single crystal semiconductor layer 404 may be improved. Embodiment Mode 1 can be referred to for heat treatment temperature and a laser to be used.

Also in this embodiment mode, similarly to Embodiment Mode 1, a semiconductor substrate can be manufactured by providing the bonding layer 406 at the side of the substrate 410 having the insulating surface. In this case, after the steps up to plasma treatment shown in FIG. 4C are performed, a process in FIGS. 3A to 3C is performed.

As described, a semiconductor substrate in which a defect in an interface between the single crystal semiconductor layer 404 and the bonding layer 406 is reduced can be provided. Accordingly, a semiconductor device in which a characteristic of a semiconductor element to be formed later is drastically improved can be provided. In this embodiment mode, by providing the protective layer 450, damage to the single crystal semiconductor layer 404 due to ion irradiation is reduced. As a result, the defect can be reduced, and a characteristic in the semiconductor element can be further improved. Moreover, the protective layer 450 is removed after the ion irradiation, the deteriorated protective layer 450 is not left; therefore, a semiconductor substrate having an extremely favorable characteristic can be provided.

This embodiment mode can be appropriately combined with Embodiment Mode 1.

Embodiment Mode 3

In this embodiment mode, an example of a method for manufacturing a semiconductor device of the present invention is described with reference to FIGS. 6A to 6D to FIGS. 9A and 9B. In this embodiment mode, a liquid crystal display device is described as an example of the semiconductor device; however, the semiconductor device of the invention is not limited to this.

Figure 6A:
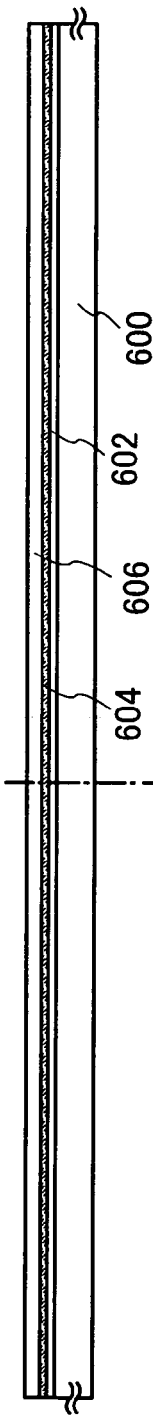
FIGS. 6A to 6D are diagrams showing a manufacturing process of a semiconductor substrate in connection with an Embodiment Mode of the present invention.

First, a single crystal semiconductor layer is formed over a substrate having an insulating surface using any of the methods shown in Embodiment Mode 1 or Embodiment Mode 2 (see FIG. 6A). Here, a structure in which a barrier layer 602, a bonding layer 604, and a single crystal semiconductor layer 606 are provided in order over a substrate 600 having an insulating surface is described; however, the invention is not limited to this. Then, the single crystal semiconductor layer 606 and the bonding layer 604 are patterned into a desired shape, thereby forming island-shaped single crystal semiconductor layers.

As an etching process in patterning, either plasma etching (dry etching) or wet etching can be used. For treating a large-sized substrate, plasma etching is suitable. As an etching gas, a fluorine-based gas such as $CF_4$ or $NF_3$ or a chlorine-based gas such as $Cl_2$ or $BCl_3$ is used, and an inert gas such as He or Ar may be appropriately added thereto. When the etching is performed by an atmospheric pressure discharge, electric discharging can be performed locally, and therefore, a mask layer does not need to be formed over the entire surface of a substrate.

After patterning the single crystal semiconductor layer 606 and the bonding layer 604, a p-type impurity such as boron, aluminum, or gallium is preferably added thereto in order to control the threshold voltage. For example, as the p-type impurity, boron can be added at a concentration of $5 \times 10^{17}$ atoms/cm$^3$ to $1 \times 10^{18}$ atoms/cm$^3$.

A silicon nitride layer and a silicon oxide layer are formed as the barrier layer 602 in a stacked-layer structure over the substrate 600 having the insulating surface. By providing the barrier layer 602, contamination of the single crystal semiconductor layer 606 due to movable ions can be prevented. Note that a silicon nitride oxide layer, an aluminum nitride layer, or an aluminum nitride oxide layer may be used instead of using the silicon nitride layer.

Figure 6B:
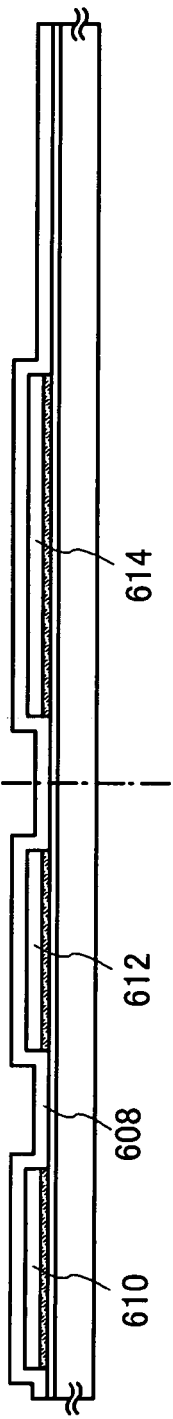
Figure 6C:
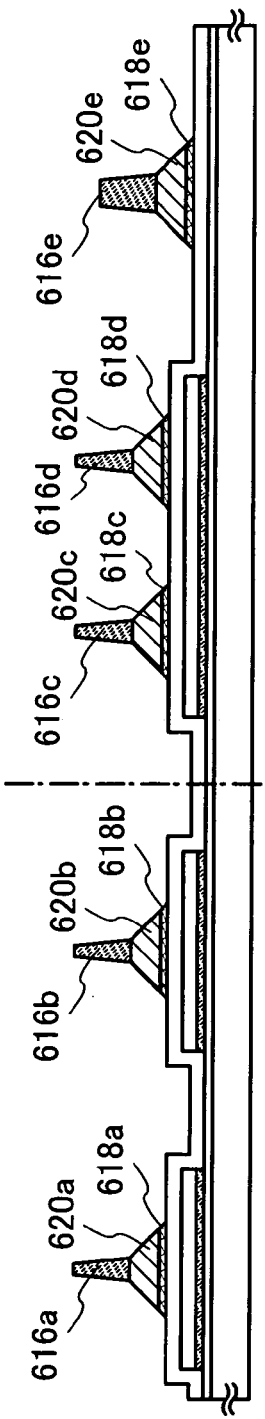

Then, a gate insulating layer 608 covering the island-shaped single crystal semiconductor layer is formed (see FIG. 6B). Here, the island-shaped semiconductor layers formed by patterning are referred to as single crystal semiconductor layers 610, 612, and 614, respectively, for the sake of convenience. The gate insulating layer 608 is formed of an insulating film containing silicon at a thickness of approximately 10 nm to 150 nm by a plasma CVD method, a sputtering method, or the like. Specifically, the gate insulating layer 608 may be formed by using a material such as an oxide material or nitride material of silicon, typified by silicon nitride, silicon oxide, silicon oxynitride, and silicon nitride oxide. Note that the gate insulating layer 608 may have a single layer structure or a stacked layer structure. Further, a thin silicon oxide film with a thickness of 1 nm to 100 nm, preferably 1 nm to 10 nm, or more preferably 2 nm to 5 nm may be formed between the single semiconductor layer and the gate insulating layer. In order to form a gate insulating film having less gate leakage current at a low temperature, a rare gas element such as argon may be contained in a reaction gas.

Next, a first conductive film and a second conductive film, which serve as gate electrode layers, are stacked over the gate insulating layer 608. The first conductive film may be formed with a thickness of about 20 nm to 100 nm, and the second conductive film may be formed with a thickness of about 100 nm to 400 nm. In addition, the first conductive film and the second conductive film can be formed by a sputtering method, an evaporation method, a CVD method, or the like. The first conductive film and the second conductive film may be formed of an element selected from tantalum (Ta), tungsten (W), titanium (Ti), molybdenum (Mo), aluminum (Al), copper (Cu), chromium (Cr), or neodymium (Nd), an alloy material or a compound material containing the element as its main component, or the like. Further, for the first and second conductive films, a semiconductor film typified by a polycrystal silicon film doped with an impurity element such as phosphorus; an AgPdCu alloy, or the like may be used. This embodiment mode is described using a two-layer structure; however, the invention is not limited to this structure. And a stacked-layer structure of three or more layers or a single layer structure may be used.

Then, a mask 616a, a mask 616b, a mask 616c, a mask 616d, and a mask 616e each of which is formed of a resist material are formed by a photolithography method. The first conductive film and the second conductive film are processed into a desired shape using the above masks, thereby forming a first gate electrode layer 618a, a first gate electrode layer 618b, a first gate electrode layer 618c, a first gate electrode layer 618d, a first conductive layer 618e, a conductive layer 620a, a conductive layer 620b, a conductive layer 620c, a conductive layer 620d, and a conductive layer 620e (see FIG. 6C).

Etching can be performed to form a desired tapered shape by an ICP (Inductively Coupled Plasma) etching method with appropriate control of the etching conditions (e.g., the amount of electric energy applied to a coiled electrode layer, the amount of electric energy applied to an electrode layer on the substrate side, and the electrode temperature on the substrate side). An angle and the like of the tapered shape may also be controlled by the shape of the masks. Further, as an etching gas, the following can be appropriately used: a chlorine-based gas typified by $Cl_2$, $BCl_3$, $SiCl_4$, or $CCl_4$; a fluorine-based gas typified by $CF_4$, $SF_6$, or $NF_3$; or $O_2$. In this embodiment mode, the second conductive film is etched using an etching gas containing $CF_4$, $Cl_2$, and $O_2$, and the first conductive film is successively etched using an etching gas containing $CF_4$ and $Cl_2$.

Subsequently, the conductive layer 620a, the conductive layer 620b, the conductive layer 620c, the conductive layer 620d, and the conductive layer 620e are processed into a desired shape using the mask 616a, the mask 616b, the mask 616c, the mask 616d, and the mask 616e. At this time, etching is conducted with an etching condition of high selectivity of the second conductive film which forms the conductive layers with respect to the first conductive film which forms the first gate electrode layers and the first conductive layer. A second gate electrode layer 622a, a second gate electrode layer 622b, a second gate electrode layer 622c, a second gate electrode layer 622d, and a second conductive layer 622e are formed by this etching. In this embodiment mode, the second gate electrode layers and the second conductive layer also have a tapered shape, in which a taper angle is larger than that of the first gate electrode layers 618a, 618b, 618c, and 618d and the first conductive layer 618e. Here, "taper angle" refers to an angle formed by the meeting of a bottom surface with a side surface of an object. Thus, when the taper angle is 90°, the conductive layer has a perpendicular side surface to the bottom surface of the conductive layer. By setting the taper angle to smaller than 90°, coverage of a film to be stacked thereover is improved and a defect is reduced. In this embodiment mode, $Cl_2$, $SF_6$, and $O_2$ are used as an etching gas for forming the second gate electrode layers and the second conductive layer.

Figure 6D:
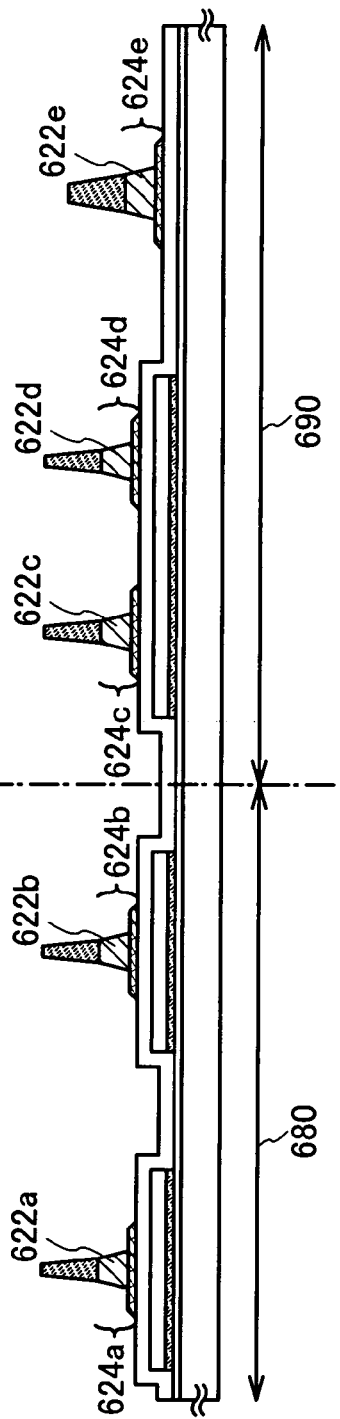

Through the aforementioned steps, a gate electrode layer 624a and a gate electrode layer 624b can be formed in a peripheral driver circuit region 680, and a gate electrode layer 624c, a gate electrode layer 624d, and a conductive layer 624e can be formed in a pixel region 690 (see FIG. 6D). Note that the masks 616a, 616b, 616c, 616d, and 616e are removed after the aforementioned steps.

Next, an impurity element which imparts n-type conductivity is added using the gate electrode layers 624a, 624b, 624c, and 624d as masks to form first n-type impurity regions 626a, 626b, 628a, 628b, 630a, 630b, and 630c (see FIG. 7A). In this embodiment mode, doping is performed by using phosphine ($PH_3$) as a doping gas containing an impurity element. Here, phosphorus (P) that is an impurity element imparting n-type conductivity is added to the first n-type impurity regions at a concentration of about $1\times10^{17}$ atoms/$cm^3$ to $5\times10^{18}$ atoms/$cm^3$.

Next, a mask 632a, a mask 632b, and a mask 632c for covering the single crystal semiconductor layers 610 and a part of the single crystal semiconductor layer 614 are formed. Then, an impurity element which imparts n-type conductivity is added using the masks 632a, 632b, and 632c, and the second gate electrode layer 622b as masks. As a result, a second n-type impurity region 634a, a second n-type impurity region 634b, a third n-type impurity region 636a, a third n-type impurity region 636b, a second n-type impurity region 640a, a second n-type impurity region 640b, a second n-type impurity region 640c, a third n-type impurity region 642a, a third n-type impurity region 642b, a third n-type impurity region 642c, and a third n-type impurity region 642d are formed. In this embodiment mode, doping is performed by using phosphine ($PH_3$) as a doping gas containing an impurity element. Here, phosphorus (P) that is an impurity element imparting n-type conductivity is added to the second n-type impurity regions at a concentration of about $5\times10^{19}$ atoms/$cm^3$ to $5\times10^{20}$ atoms/$cm^3$. An impurity element which imparts n-type conductivity is added to the third n-type impurity regions 636a and 636b so as to contain the n-type impurity element at about the same concentration as or at a slightly higher concentration than the third n-type impurity regions 642a to 642d. Furthermore, a channel formation region 638, a channel formation region 644a, and a channel formation region 644b are formed (see FIG. 7B).

The second n-type impurity regions are high-concentration impurity regions and function as source regions or drain regions. On the other hand, the third n-type impurity regions are low-concentration impurity regions and function as so-called lightly doped drain (LDD) regions. The third n-type impurity regions 636a and the 636b are formed so as to be overlapped with the first gate electrode layer 618b. Accordingly, an electric field around a source or a drain can be relieved and deterioration of on-current due to hot carriers can be suppressed. On the other hand, the third n-type impurity regions 642a to 642d are not overlapped with the gate electrode layers 624c and 624d, which has an effect to reduce an off current.

Next, the masks 632a, 632b, and 632c are removed, and masks 646a and 646b which cover the single crystal semiconductor layers 612 and 614 are formed. An impurity element which imparts p-type conductivity is added using the masks 646a and 646b, and the gate electrode layer 624a as masks to form first p-type impurity regions 648a and 648b and second p-type impurity regions 650a and 650b. In this embodiment mode, doping is performed using diborane ($B_2H_6$) as a doping gas including an impurity element. Here, boron (B) which is an impurity element imparting p-type conductivity is added to the first p-type impurity regions and the second p-type impurity regions at a concentration of about $1\times10^{20}$ atoms/cm$^3$ to $5\times10^{21}$ atoms/cm$^3$. Further, a channel formation region 652 is formed (see FIG. 7C).

The first p-type impurity regions are high-concentration impurity regions and each function as a source or a drain. On the other hand, the second p-type impurity regions are low-concentration impurity regions, which are so-called lightly doped drain (LDD) regions.

Then, the masks 646a and 646b are removed. After the masks are removed, an insulating film may be formed to cover the side surfaces of the gate electrode layers. The insulating film can be formed by a plasma CVD method or a low pressure CVD (LPCVD) method. Heat treatment, intense light irradiation, or laser light irradiation may be performed to activate the impurity elements.

Figure 8A:
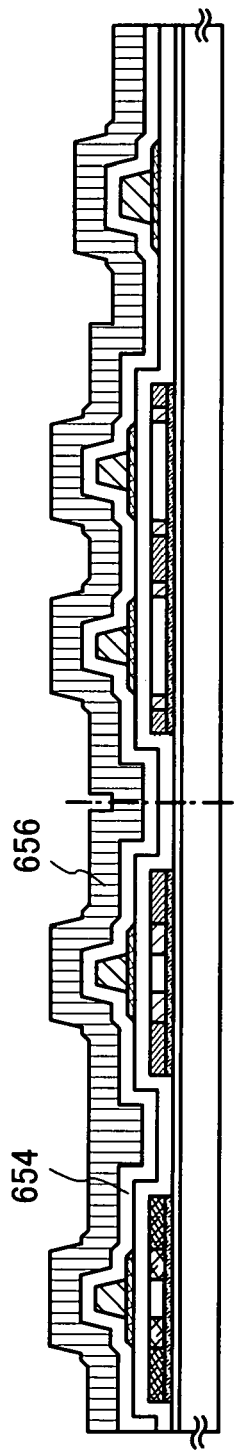
FIGS. 8A to 8C are diagrams showing a manufacturing process of a semiconductor substrate in connection with an Embodiment Mode of the present invention.

Subsequently, an interlayer insulating layer which covers the gate electrode layers and the gate insulating layer is formed. In the present embodiment mode, a stacked-layer structure of insulating films 654 and 656 is employed (see FIG. 8A). A silicon nitride oxide film is formed as the insulating film 654 with a thickness of 100 nm and a silicon oxynitride film is formed as the insulating film 656 with a thickness of 900 nm. In this embodiment mode, the interlayer insulating layer has a two-layer stacked structure; however, it may have a single layer structure or a stacked structure including three or more layers. In this embodiment mode, the insulating films 654 and 656 are sequentially formed by a plasma CVD method. Note that the materials of the insulating films 654 and 656 are not limited to the above materials.

The insulating films 654 and 656 can be formed using a material selected from substances including silicon oxide, silicon nitride, aluminum oxide, aluminum nitride, aluminum oxynitride, aluminum nitride oxide having a higher content of nitrogen than that of oxygen, diamond-like carbon (DLC), carbon film containing nitrogen, and other inorganic insulating materials. Further, a siloxane resin may be used as well. A siloxane resin is a resin having a Si—O—Si bond. Siloxane has a skeleton structure formed by a bond of silicon (Si) and oxygen (O) and has an organic group containing at least hydrogen (for example, an alkyl group or an aryl group) as a substituent. Alternatively, a fluoro group may be used as a substituent, or both a fluoro group and an organic group containing at least hydrogen can be used as a substituent. Further, an organic insulating material such as polyimide, acrylic, polyamide, polyimide amide, benzocyclobutene, or polysilazane can be used.

Next, contact holes (openings) that reach the single crystal semiconductor layers and the gate electrode layers are formed in the insulating films 654 and 656 and the gate insulating layer 608, using a resist mask. Etching may be performed once or plural times according to etching selectivity of a material to be used. In the present embodiment mode, first etching is performed with a condition that the insulating film 656 that is a silicon oxynitride film, the insulating film 654 that is a silicon nitride oxide film, and the gate insulating layer 608 have selectivity, and the insulating film 656 is removed. Then, a second etching is performed to remove the insulating film 654 and the gate insulating layer 608, and the openings which reach source and drain regions are formed.

Then, a conductive film is formed to cover the openings, and the conductive film is etched. Therefore, a source electrode layer or a drain electrode layer 658a, a source electrode layer or a drain electrode layer 658b, a source electrode layer or a drain electrode layer 660a, a source electrode layer or a drain electrode layer 660b, a source electrode layer or a drain electrode layer 662a, and a source electrode layer or a drain electrode layer 662b, each of which is electrically connected to a part of a source region or a drain region, respectively are formed. For the each source electrode layer or drain electrode layer, one or a plurality of elements selected from aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), nickel (Ni), zinc (Zn), niobium (Nb), silicon (Si), phosphorus (P), boron (B), arsenic (As), gallium (Ga), indium (In), and tin (Sn); a compound or alloy material that contains one of the given elements as its main component (for example, indium tin oxide (ITO), indium zinc oxide (IZO), indium tin oxide that contains silicon oxide (ITSO), zinc oxide (ZnO), aluminum-neodymium (Al—Nd), magnesium-silver (MgAg), or the like); a material that is a combination of any of these compounds; or the like can be used. In addition to what is given above, a silicide (for example, aluminum-silicon, molybdenum-silicon, or nickel silicide), a compound that contains nitrogen (for example, titanium nitride, tantalum nitride, or molybdenum nitride), silicon (Si) doped with an impurity element such as phosphorus (P) or the like, or the like may be used.

Figure 8B:
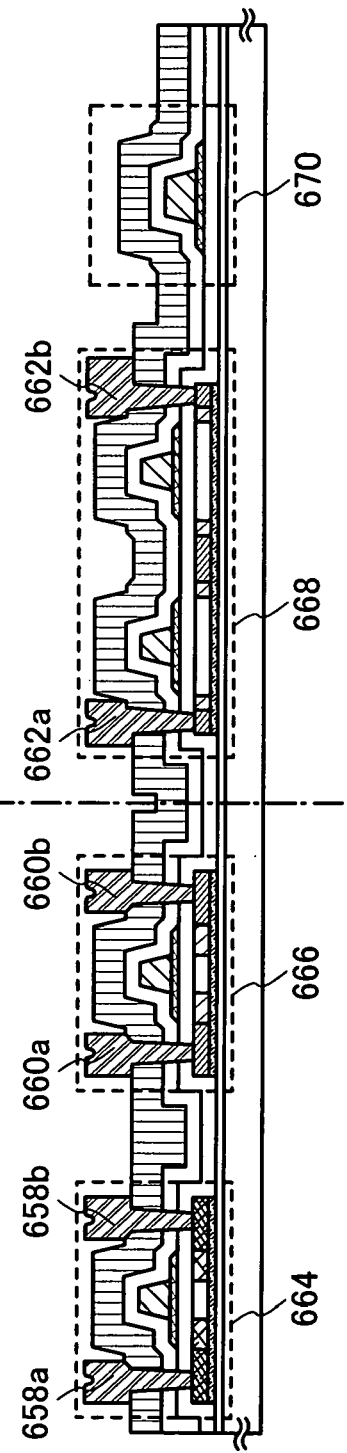

Through the above steps, a p-channel thin film transistor 664 and an n-channel thin film transistor 666, and an n-channel thin film transistor 668 and a capacitor wiring 670 are formed in the peripheral driver circuit region 680 and the pixel region 690, respectively (see FIG. 8B).

Next, an insulating film 672 is formed as a second interlayer insulating layer. The insulating film 672 can be formed of a material selected from substances including silicon oxide, silicon nitride, silicon oxynitride, silicon nitride oxide, aluminum oxide, aluminum nitride, aluminum oxynitride, aluminum nitride oxide having a higher content of nitrogen than that of oxygen, diamond-like carbon (DLC), a nitrogen-containing carbon film, PSG (phosphosilicate glass), BPSG (borophosphosilicate glass), an alumina film, polysilazane, and other inorganic insulating materials. Further, a siloxane resin may be used as well. An organic insulating material such as polyimide, acrylic, polyamide, polyimide amide or benzocyclobutene may also be used.

In this embodiment mode, since an interlayer insulating layer provided for planarization needs to have high heat resistance, a high insulating property, and a high level of planarity, the interlayer insulating layer is preferably formed by a coating method typified by a spin coating method.

Figure 8C:
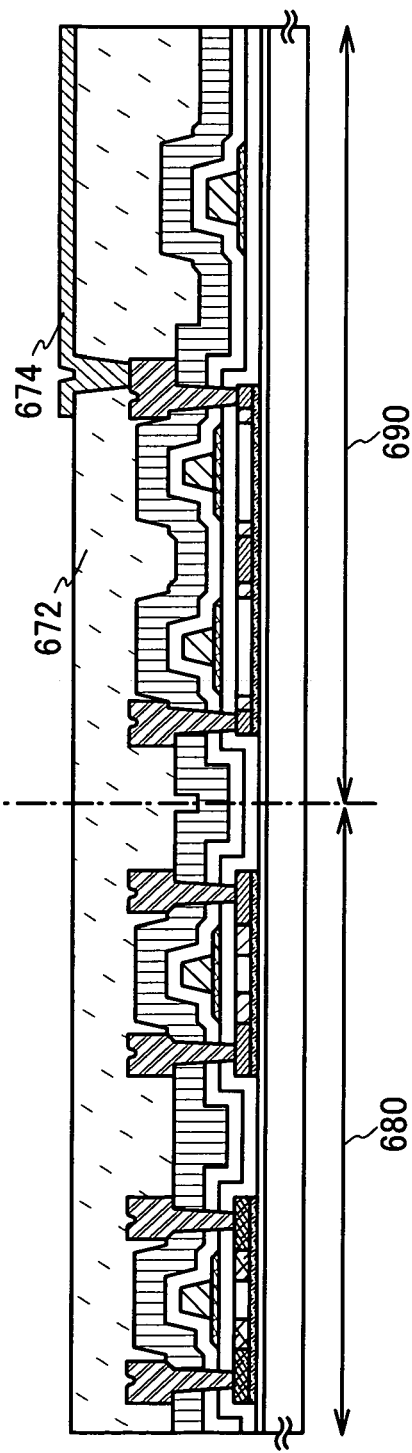

Subsequently, a contact hole is formed in the insulating film 672 of the pixel region 690, and a pixel electrode layer 674 is formed (see FIG. 8C). The pixel electrode layer 674 can be formed using indium tin oxide (ITO), indium zinc oxide (IZO) in which indium oxide is mixed with zinc oxide, a conductive material in which indium oxide is mixed with silicon oxide, organic indium, organic tin, indium oxide containing tungsten oxide, indium zinc oxide containing tungsten oxide, indium oxide containing titanium oxide, indium tin oxide containing titanium oxide, or metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag), or an alloy or a metal nitride thereof.

A conductive composition including a conductive high molecular compound (also referred to as a conductive polymer) can be used for the pixel electrode layer 674. In the case where a thin film is formed using the conductive composition as the pixel electrode, it is preferable that sheet resistance of the thin film be 10000 Ω/sq. or less. In the case where a thin film is formed as a pixel electrode layer having a light-transmitting property, it is preferable that light transmittance at a wavelength of 550 nm be 70% or more, and resistivity of the conductive high molecular compound included be 0.1 Ω·cm or lower.

As the conductive high molecular compound, a so-called π electron conjugated conductive high molecular compound can be used. For example, polyaniline and a derivative thereof, polypyrrole and a derivative thereof, polythiophene and a derivative thereof, or a copolymer of those materials can be given.

Specific examples of the conjugated conductive high molecular compound are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), and poly(3-anilinesulfonic acid).

The above conductive high molecular compound may be used alone, or an organic resin may be added thereto in order to adjust the characteristic of the films.

As for an organic resin, as long as a resin is compatible to a conductive high molecular compound or a resin can be mixed and dispersed into a conductive high molecular compound, a thermosetting resin, a thermoplastic resin, or a photocurable resin may be used. Specific examples of the organic resin are given below: a polyester-based resin such as polyethylene terephthalate, polybutylene terephthalate, or polyethylene naphthalate; a polyimide-based resin such as polyimide or polyamide imide; a polyamide resin such as polyamide 6, polyamide 66, polyamide 12, or polyamide 11; a fluorine resin such as poly(vinylidene fluoride), polyvinyl fluoride, polytetrafluoroethylene, ethylene tetrafluoroethylene copolymer, or polychlorotrifluoroethylene; a vinyl resin such as polyvinyl alcohol, polyvinyl ether, polyvinyl butyral, polyvinyl acetate, or polyvinyl chloride; an epoxy resin; a xylene resin; an aramid resin; a polyurethane-based resin; a polyurea-based resin, a melamine resin; a phenol-based resin; polyether; an acrylic-based resin, or a copolymer of any of those resins.

Furthermore, by doping a conductive composition with acceptor type dopant or donor type dopant, an oxidation-reduction potential of a conjugated electron of a conjugated conductive high molecular compound is changed; therefore, electrical conductivity may be adjusted.

As the acceptor type dopant, a halogen compound, a Lewis acid, a protonic acid, an organic cyano compound, an organic metal compound, or the like can be used. Examples of a halogen compound are chlorine, bromine, iodine, iodine chloride, iodine bromide, and iodine fluoride. Examples of a Lewis acid are phosphorus pentafluoride, arsenic pentafluoride, antimony pentafluoride, boron trifluoride, boron trichloride, and boron tribromide. Examples of a protonic acid are an inorganic acid such as a hydrochloric acid, a sulfuric acid, a nitric acid, a phosphoric acid, a fluoric acid, a hydrofluoric acid, and a perchloric acid, and an organic acid such as an organic carboxylic acid and an organic sulfonic acid. As the organic carboxylic acid and the organic sulfonic acid, an organic carboxylic acid compound and an organic sulfonic acid compound can be used. As the organic cyano compound, a compound having two or more cyano groups in a conjugated bonding, for example, tetracyanoethylene, tetracyanoethylene oxide, tetracyanobenzene, tetracyanoquinodimethane, and tetracyanoazanaphthalene are given.

As the donor type dopant, alkali metal, alkaline-earth metal, a quaternary amine compound, or the like can be used.

The aforementioned conductive composition is dissolved in water or an organic solvent (e.g., an alcohol-based solvent, a ketone-based solvent, an ester-based solvent, a hydrocarbon-based solvent, an aromatic-based solvent) and a thin film which serves as the pixel electrode layer 674 can be formed by a wet process such as an application method, a coating method, a droplet discharge method (also referred to as an ink-jet method), a printing method, or the like.

Figure 9A:
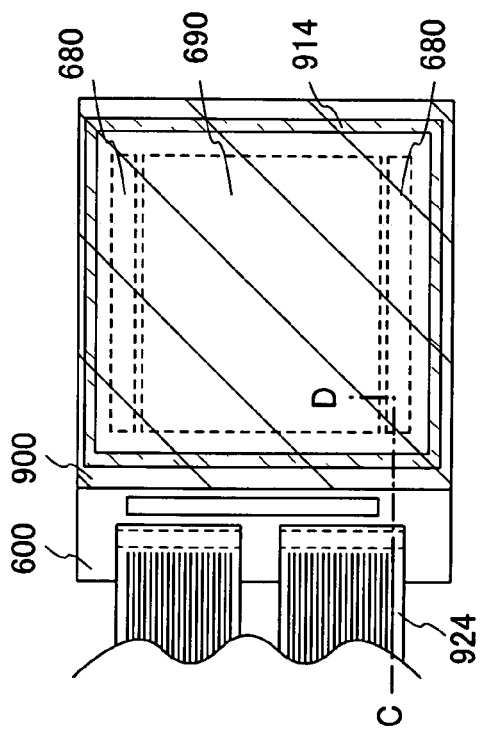
FIGS. 9A and 9B are a plane view and a cross sectional view of a semiconductor device in connection with an Embodiment Mode of the present invention, respectively.
Figure 9B:
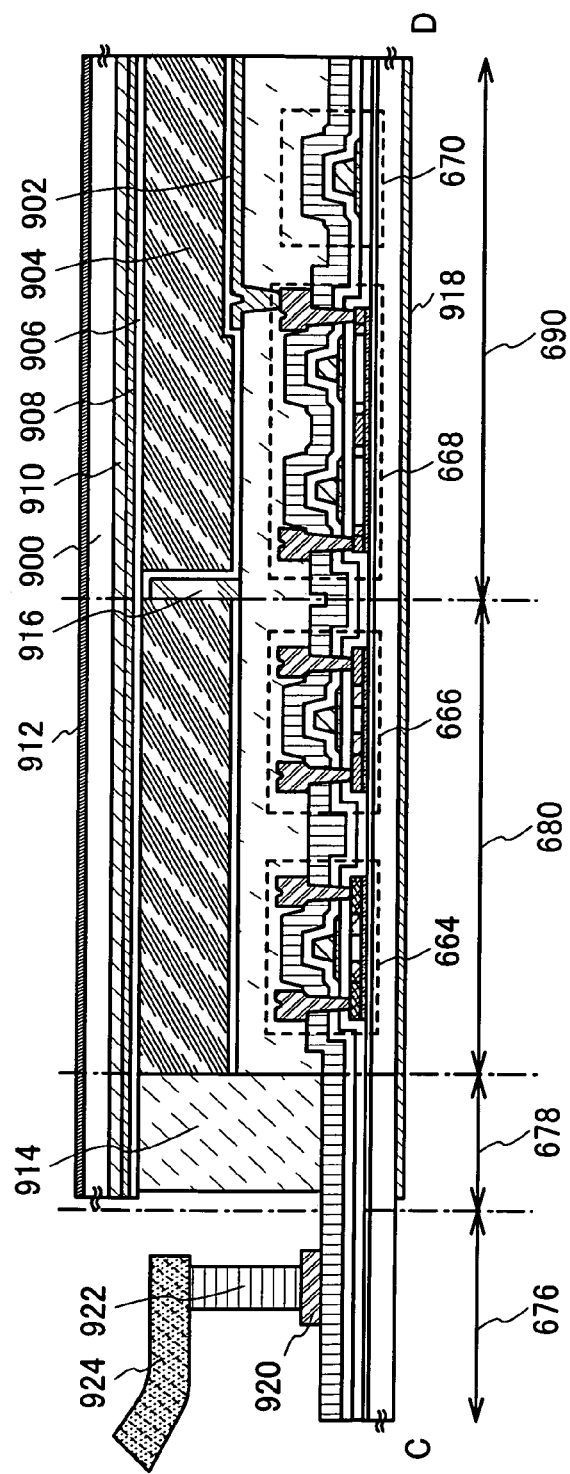

Subsequently, an insulating layer 902 referred to as an alignment film is formed to cover the pixel electrode layer 674 and the insulating film 672 (see FIG. 9B). The insulating layer 902 can be formed by a screen printing method or an offset printing method. FIGS. 9A and 9B are a plane view and a cross sectional view of a semiconductor device. FIG. 9A is a plane view of the semiconductor device, and FIG. 9B is a cross sectional view taken along a line C-D of FIG. 9A. The semiconductor device includes an external terminal connection region 676, a sealing region 678, a peripheral driver circuit region 680, and a pixel region 690.

After forming the insulating layer 902, rubbing treatment is performed. An insulating layer 906 which serves as an alignment film can be formed in a similar manner to the insulating layer 902.

Then, a counter substrate 900 is attached to the substrate 600 having the insulating surface with a sealing material 914 and a spacer 916 interposed therebetween, and a liquid crystal layer 904 is provided in a gap therebetween. The counter substrate 900 is provided with the insulating layer 906 serving as an alignment film, a conductive layer 908 serving as a counter electrode, a colored layer 910 serving as a color filter, a polarizer 912 (also referred to as a polarizing plate), and the like. Note that the substrate 600 having the insulating surface is provided with a polarizer 918 (polarizing plate); however, the present invention is not limited thereto. For example, in a reflective liquid crystal display device, a polarizer may be provided for either a counter substrate or a substrate.

Subsequently, an FPC 924 is connected to a terminal electrode layer 920 that is electrically connected to the pixel region, with an anisotropic conductive layer 922 interposed therebetween. The FPC 924 has a function of transmitting a signal from the external. The liquid crystal display device can be manufactured by the above-described process.

In the present invention, by performing a plasma treatment to the single crystal semiconductor layer 606, a defect in an interface between the bonding layer 604 and the single crystal semiconductor layer 606 is reduced. As a result, a semiconductor element having excellent characteristics can be manufactured in each of a pixel region and a peripheral circuit region. Specifically, in the pixel region and the peripheral circuit region, a transistor of which fluctuation in a threshold voltage is small, mobility is high, and subthreshold swing ($V_g$ which is necessary to increase $I_d$ by an order of magnitude in $I_d$-$V_g$ curve) is small can be manufactured. Further, a highly reliable transistor can be manufactured.

By using the transistor having excellent characteristics as described in this embodiment mode, sufficient high-speed operation is realized in a peripheral circuit region and an accurate gray scale display with high-speed operation is realized in a pixel region. In other words, a semiconductor device having high image quality and excellent moving image characteristics can be provided. Moreover, since it is not necessary to provide an IC chip externally, thickness and an area of a frame portion of a semiconductor device can be reduced, and a semiconductor device which effectively utilizes a display area can be provided at low cost.

Note that a method for manufacturing a liquid crystal display device is described in this embodiment mode; however, the present invention is not limited to this. This embodiment mode can be combined with Embodiment Mode 1 and 2 as appropriate.

Embodiment Mode 4

In this embodiment mode, a semiconductor device (electroluminescence display device) having a light emitting element according to the present invention is described. Embodiment Mode 3 can be referred to for the method for manufacturing a transistor used in a peripheral circuit region, a pixel region, and the like; therefore, detailed description is omitted.

In a semiconductor device having a light emitting element, any manner of bottom emission, top emission, or dual emission is used. In this embodiment mode, a semiconductor device using bottom emission is described with reference to FIGS. 10A and 10B; however, the present invention is not limited to this.

Figure 10A:
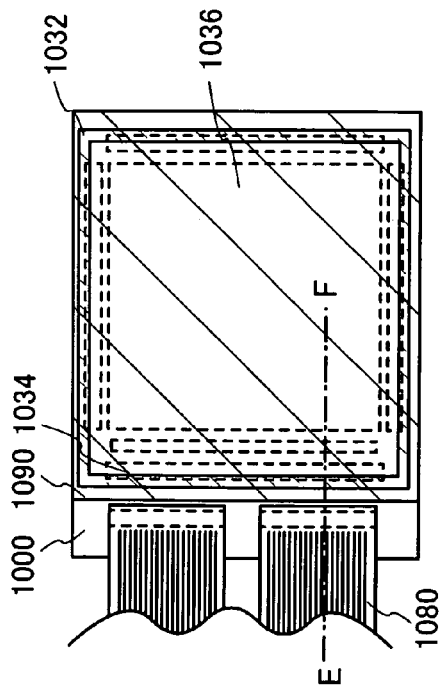
FIGS. 10A and 10B are a plane view and a cross sectional view of a semiconductor device in connection with an Embodiment Mode of the present invention, respectively.
Figure 10B:
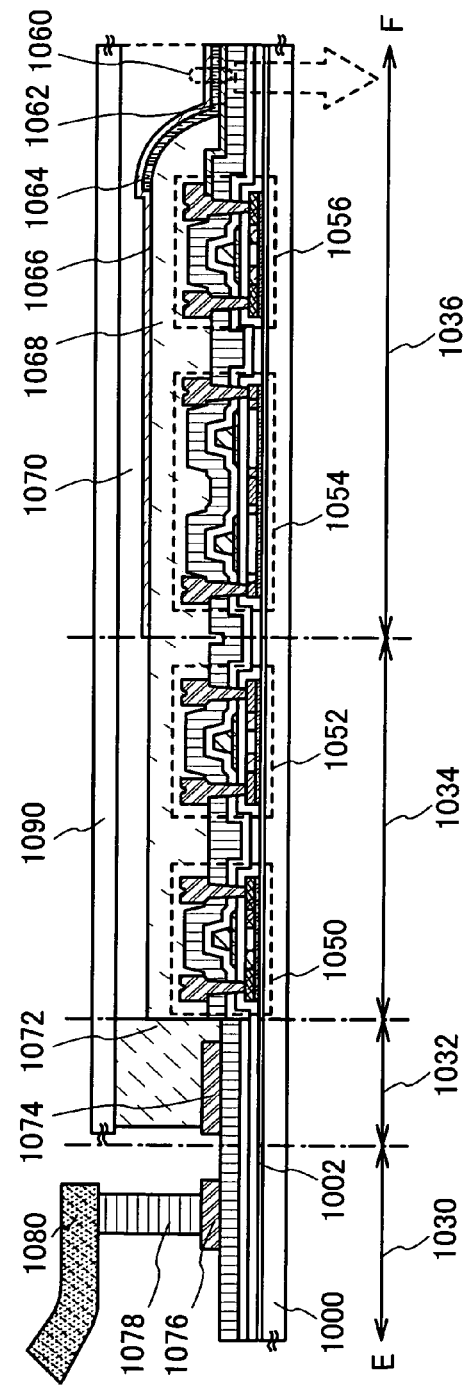

The semiconductor device in FIGS. 10A and 10B emits light to the lower side (in the direction of an arrow shown in the drawing). FIG. 10A is a plan view showing the semiconductor device, and FIG. 10B is a cross-sectional view taken along a line E-F of FIG. 10A. The semiconductor device of FIGS. 10A and 10B includes an external terminal connection region 1030, a sealing region 1032, a driver circuit region 1034, and a pixel region 1036.

The semiconductor device shown in FIGS. 10A and 10B includes an element substrate 1000, an insulating film 1002, a thin film transistor 1050, a thin film transistor 1052, a thin film transistor 1054, a thin film transistor 1056, a light emitting element 1060, an insulating layer 1068, a filling material 1070, a sealing material 1072, a wiring layer 1074, a terminal electrode layer 1076, an anisotropic conductive layer 1078, an FPC 1080, and a sealing substrate 1090. Note that the light emitting element 1060 includes a first electrode layer 1062, a light emitting layer 1064, and a second electrode layer 1066.

As the first electrode layer 1062, a conductive material having a light-transmitting property is used so as to transmit light emitted from the light emitting layer 1064. On the other hand, as the second electrode layer 1066, a conductive material which can reflect light emitted from the light emitting layer 1064 is used.

As the first electrode layer 1062, indium oxide containing tungsten oxide, indium zinc oxide containing tungsten oxide, indium oxide containing titanium oxide, indium tin oxide containing titanium oxide, or the like can be used. Of course, indium tin oxide (ITO), indium zinc oxide (IZO), indium tin oxide added with silicon oxide (ITSO), or the like can be used.

As the first electrode layer 1062, a conductive composition including a conductive high molecular compound (also referred to as a conductive polymer) can be used. Embodiment Mode 3 can be referred to for the detail; therefore, description is omitted here.

As the second electrode layer 1066, a conductive film formed of titanium, tungsten, nickel, gold, platinum, silver, copper, tantalum, molybdenum, aluminum, magnesium, calcium, lithium, or an alloy thereof, or the like may be used. It is preferable to use a substance having high reflectivity in a visible light range, and an aluminum film is used in this embodiment mode.

In the case of applying each manner of top emission and dual emission, an electrode layer may be appropriately designed. Specifically, in the case of applying the top emission, the first electrode layer 1062 is formed using a reflective material and the second electrode layer 1066 is formed using a light-transmitting material. In the case of applying dual emission, the first electrode layer 1062 and the second electrode layer 1066 are formed using a light-transmitting material. Note that in the case of applying bottom emission or top emission, a structure may be that one electrode layer is formed using a light-transmitting material, and the other electrode layer is formed to have a stacked-layer structure using a light-transmitting material and a light reflective material. A material which can be used for forming the electrode layer is the same as the case of applying the bottom emission, description is omitted.

Further, even if a material such as a metal film which does not have a light-transmitting property is used, light can be transmitted by forming the layer to be thin (about 5 to 30 nm). Accordingly, an electrode layer which can transmit light can be manufactured by using the above-mentioned light reflective material.

A color filter (colored layer) may be formed on the sealing substrate 1090. The color filter (colored layer) can be formed by an evaporation method or a droplet discharge method. Furthermore, a color conversion layer may be used.

In the present invention, by performing plasma treatment to a single crystal semiconductor layer, a defect in an interface between the bonding layer and the single crystal semiconductor layer is reduced. As a result, a semiconductor element having excellent characteristics can be manufactured in each of a pixel region and a peripheral circuit region. Specifically, in the pixel region and the peripheral circuit region, a transistor of which fluctuation in a threshold voltage is small, mobility is high, and subthreshold swing ($V_g$ which is necessary to increase $I_d$ by an order of magnitude in $I_d$-$V_g$ curve) is small can be manufactured. Further, a highly reliable transistor can be manufactured.

By using a transistor having excellent characteristics as described in this embodiment mode, sufficient high-speed operation is realized in a peripheral circuit region and an accurate gray scale display with high-speed operation is realized in a pixel region. In other words, a semiconductor device having high image quality and excellent moving image characteristics can be provided. Moreover, since it is not necessary to provide an IC chip externally, thickness and an area of a frame portion of a semiconductor device can be reduced, and a semiconductor device which effectively utilizes a display area can be provided at low cost.

The embodiment mode is described using an electroluminescence display device; however, the present invention is not limited to this. This embodiment mode can be combined with Embodiment Modes 1 to 3 as appropriate.

Embodiment Mode 5

In this embodiment mode, another example of a semiconductor device according to the present invention is described with reference to FIG. 11 and FIG. 12. In this embodiment mode, a microprocessor and an electronic tag are given for the description; however the semiconductor device of the invention is not limited to these.

Figure 11:
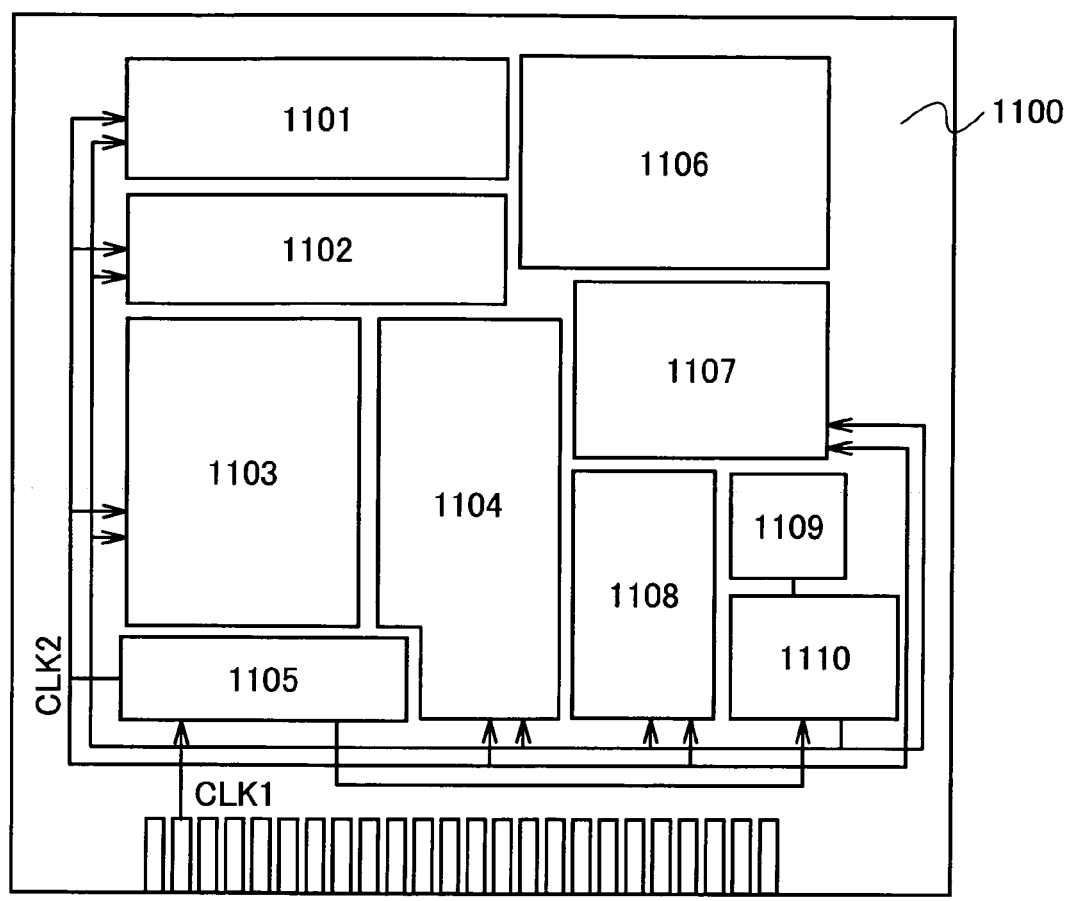
FIG. 11 is a diagram showing a structure of a semiconductor device in connection with an Embodiment Mode of the present invention.
Figure 12:
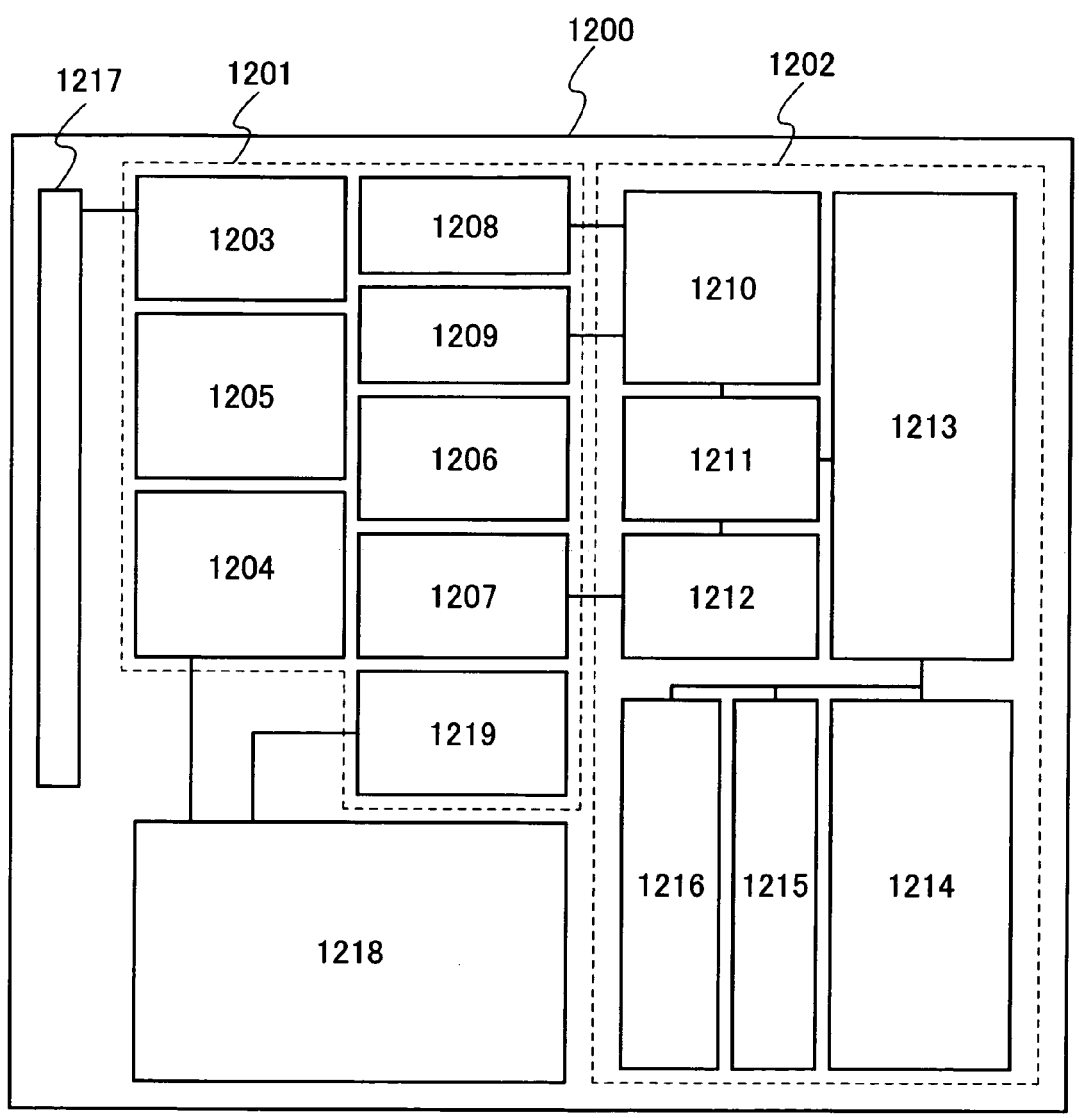
FIG. 12 is a diagram showing a structure of a semiconductor device in connection with an Embodiment Mode of the present invention.

FIG. 11 shows an example of a microprocessor of the present invention. A microprocessor 1100 in FIG. 11 is manufactured using a semiconductor substrate of the invention. This microprocessor 1100 has an arithmetic logic unit (also referred to as ALU) 1101, an ALU controller 1102, an instruction decoder 1103, an interrupt controller 1104, a timing controller 1105, a register 1106, a register controller 1107, a bus interface (Bus I/F) 1108, a read only memory (ROM) 1109, and a memory interface (ROM I/F) 1110.

An instruction inputted to the microprocessor 1100 through the bus interface 1108 is inputted to the instruction decoder 1103 and decoded. Then, the instruction is inputted to the ALU controller 1102, the interrupt controller 1104, the register controller 1107, and the timing controller 1105. The ALU controller 1102, the interrupt controller 1104, the register controller 1107, and the timing controller 1105 perform various controls based on the decoded instruction. Specifically, the ALU controller 1102 generates a signal for controlling the operation of the arithmetic logic unit 1101. The interrupt controller 1104 determines an interrupt request from an external input/output device or a peripheral circuit based on its priority or the like, and processes the request while a program of the microprocessor 1100 is executed. The register controller 1107 generates an address of the register 1106, and reads/writes data from/to the register 1106 in accordance with the state of the microprocessor 1100. The timing controller 1105 generates signals for controlling timing of driving of the arithmetic logic unit 1101, the ALU controller 1102, the instruction decoder 1103, the interrupt controller 1104, and the register controller 1107. For example, the timing controller 1105 is provided with an internal clock generator for generating an internal clock signal CLK2 based on a reference clock signal CLK1, and supplies the clock signal CLK2 to each of the above-mentioned circuits. It is to be noted that the microprocessor 1100 illustrated in FIG. 11 is just an example of the simplified structure, and practical microprocessors have various structures depending on usage.

In the microprocessor 1100 of the present invention, an integrated circuit is formed using a single crystal semiconductor layer in which a crystal orientation is uniform which is bonded to a glass substrate; therefore, high processing speed and low power consumption can be realized. Further, in the microprocessor 1100 manufactured using a semiconductor substrate of the invention, plasma treatment is performed to the single crystal semiconductor layer and a defect in an interface between a bonding layer and the single crystal semiconductor layer is reduced. Accordingly, a characteristic of a semiconductor element is improved, and a microprocessor with very high performance and high reliability can be provided.

Next, an example of a semiconductor device having an arithmetic function, which is capable of transmitting and receiving data without contact, is described with reference to FIG. 12. FIG. 12 is an example of a wireless tag which operates by transmitting and receiving signal to/from an external device by wireless communication. Note that the wireless tag of the invention has a central processing unit (CPU) in its inside, and is a so-called small computer. This wireless tag 1200 has an analog circuit portion 1201 and a digital circuit portion 1202. The analog circuit portion 1201 includes a resonant circuit 1203 having a resonant capacitor, a rectifier circuit 1204, a constant voltage circuit 1205, a reset circuit 1206, an oscillator circuit 1207, a demodulation circuit 1208, and a modulation circuit 1209. The digital circuit portion 1202 includes an RF interface 1210, a control register 1211, a clock controller 1212, an interface 1213, a central processing unit (CPU) 1214, a random access memory (RAM) 1215, and a read only memory (ROM) 1216.

The operation of the wireless tag 1200 having such a structure is roughly described below. A signal received at an antenna 1217 causes induced electromotive force at the resonant circuit 1203. The induced electromotive force is stored in a capacitor portion 1218 via the rectifier circuit 1204. The capacitor portion 1218 is preferably formed using a capacitor such as a ceramic capacitor or an electric double layer capacitor. The capacitor portion 1218 may be formed over the same substrate as the wireless tag 1200 or may be attached as another component to a substrate having an insulating surface that partially constitutes the wireless tag 1200.

The reset circuit 1206 generates a signal that resets the digital circuit portion 1202 to be initialized. For example, the reset circuit 1206 generates, as a reset signal, a signal that rises with delay after increase in the power supply voltage. The oscillation circuit 1207 changes the frequency and the duty ratio of a clock signal in accordance with a control signal generated by the constant voltage circuit 1205. The demodulation circuit 1208 having a low pass filter, for example, binarizes changes in amplitude of reception signals of an amplitude shift keying (ASK) system. The modulation circuit 1209 changes the amplitude of transmission signals of an amplitude shift keying (ASK) system to be transmitted. The modulation circuit 1209 changes the resonance point of the resonant circuit 1203, thereby changing the amplitude of communication signals. The clock controller 1212 generates a control signal for changing the frequency and the duty ratio of the clock signal in accordance with the power supply voltage or current consumption in the central processing unit 1214. The power supply voltage is monitored by a power supply control circuit 1219.

A signal that is inputted to the wireless tag 1200 from the antenna 1217 is demodulated by the demodulation circuit 1208, and then divided into a control command, data, and the like by the RF interface 1210. The control command is stored in the control register 1211. The control command includes, reading of data stored in the read only memory 1216, writing of data to the random access memory 1215, an arithmetic instruction to the central processing unit 1214, and the like. The central processing unit 1214 accesses the read only memory 1216, the random access memory 1215, and the control register 1211 via the interface 1213. The interface 1213 has a function of generating an access signal for any one of the read only memory 1216, the random access memory 1215, and the control register 1211 based on an address requested by the central processing unit 1214.

As an arithmetic method of the central processing unit 1214, a method may be employed in which the read only memory 1216 stores an OS (operating system) and a reading program is executed at the time of starting operation. Alternatively, a method may be employed in which an arithmetic circuit is formed and an arithmetic process is conducted using hardware. In a method in which both hardware and software are used, a method can be used in which a part of process is conducted in a dedicated arithmetic circuit and the other part of the arithmetic process is conducted by the central processing unit 1214 using a program.

In the wireless tag 1200 of the present invention, an integrated circuit is formed using a single crystal semiconductor layer in which a crystal orientation is uniform which is bonded to a glass substrate; therefore, high processing speed and low power consumption can be realized. Further, in the wireless tag 1200 manufactured using a semiconductor substrate of the invention, plasma treatment is performed to the single crystal semiconductor layer and a defect in an interface between a bonding layer and the single crystal semiconductor layer is reduced. Accordingly, a characteristic of a semiconductor element is improved, and a microprocessor with very high performance and high reliability can be provided.

This embodiment mode can be combined with Embodiment Modes 1 to 4 as appropriate.

Embodiment Mode 6

In this embodiment mode, electronic devices in which a semiconductor device of the present invention, specifically, a display device is used will be described with reference to FIGS. 13A to 13H.

Examples of the electronic devices manufactured using the semiconductor device of the invention are as follows: video cameras; digital cameras; goggles-type displays (head-mounted displays); navigation systems; audio playback devices (car audio components and the like); computers; game machines; portable information terminals (mobile computers, cellular phones, portable game machines, electronic book readers, and the like); image playback devices provided with storage media (specifically, devices that can play storage media such as digital versatile discs (DVDs) or the like and that are equipped with a display device by which the images can be displayed); and the like.

Figure 13A:
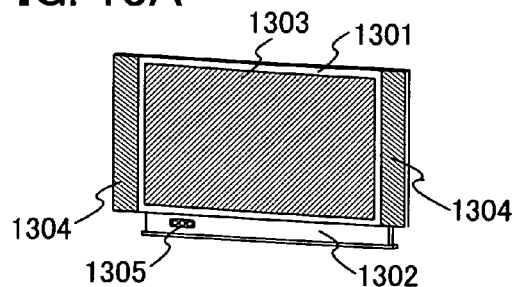
FIGS. 13A to 13H are diagrams showing electronic devices using semiconductor devices in connection with an Embodiment Mode of the present invention.

FIG. 13A is a diagram of a television set or a monitor of a personal computer. The television set or the monitor of the personal computer includes a chassis 1301, a support stand 1302, a display 1303, speakers 1304, video input terminals 1305, and the like. The semiconductor device of the present invention is used in the display 1303. By the present invention, a television set or a monitor of a personal computer with excellent image quality can be provided at low cost.

Figure 13B:
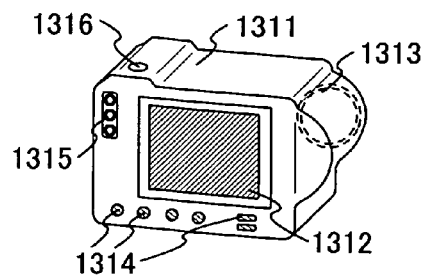

FIG. 13B is a diagram of a digital camera. On the front side part of a main body 1311, an image receiver 1313 is provided, and on the top side part of the main body 1311, a shutter button 1316 is provided. Furthermore, on the back side part of the main body 1311, a display 1312, operation keys 1314, and an external connection port 1315 are provided. The semiconductor device of the present invention is used in the display 1312. According to the present invention, a digital camera with excellent image quality can be provided at low cost.

Figure 13C:
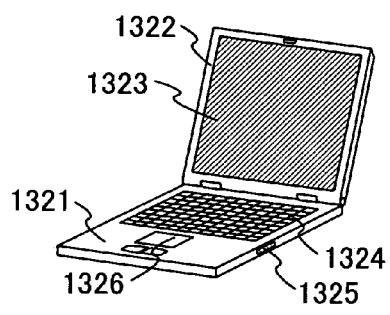

FIG. 13C is a diagram of a notebook personal computer. In a main body 1321, a keyboard 1324, an external connection port 1325, and a pointing device 1326 are provided. Furthermore, a chassis 1322 that has a display 1323 is attached to the main body 1321. The semiconductor device of the present invention is used in the display 1323. According to the present invention, a notebook personal computer with excellent image quality can be provided at low cost.

Figure 13D:
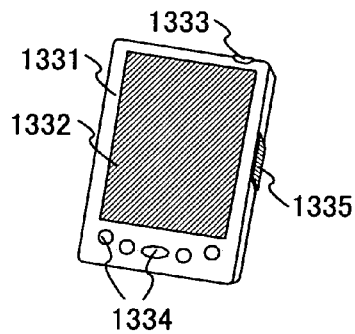

FIG. 13D is a diagram of a mobile computer that includes a main body 1331, a display 1332, a switch 1333, operation keys 1334, an infrared port 1335, and the like. Furthermore, an active matrix display device is provided in the display 1332. The semiconductor device of the present invention is used in the display 1332. According to the present invention, a mobile computer with excellent image quality can be provided at low cost.

Figure 13E:
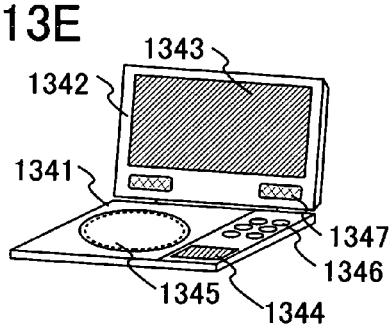

FIG. 13E is a diagram of an image playback device. In a main body 1341, a display B 1344, a storage media reader 1345, and operation keys 1346 are provided. Furthermore, a chassis 1342 that has speakers 1347 and a display A 1343 is attached to the main body 1341. The semiconductor device of the present invention is used in each of the display A 1343 and the display B 1344. According to the present invention, an image playback device with excellent image quality can be provided at low cost.

Figure 13F:
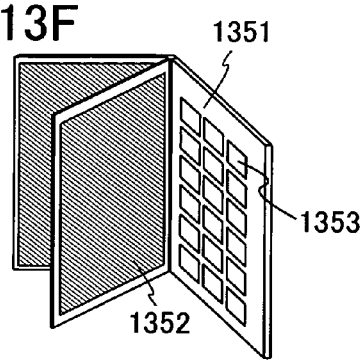

FIG. 13F is a diagram of an electronic book reader. In a main body 1351, operation keys 1353 are provided. Furthermore, a plurality of displays 1352 is attached to the main body 1351. The semiconductor device of the present invention is used in each of the displays 1352. According to the present invention, an electronic book reader with excellent image quality can be provided at low cost.

Figure 13G:
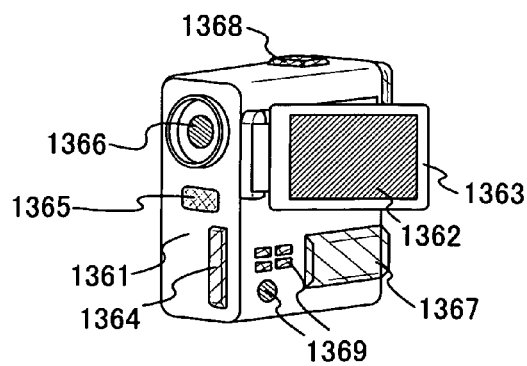

FIG. 13G is a diagram of a video camera. In a main body 1361, an external connection port 1364, a remote control receiver 1365, an image receiver 1366, a battery 1367, an audio input 1368, and operation keys 1369 are provided. Furthermore, a chassis 1363 that has a display 1362 is attached to the main body 1361. The semiconductor device of the present invention is used in the display 1362. According to the present invention, a video camera with excellent image quality can be provided at low cost.

Figure 13H:
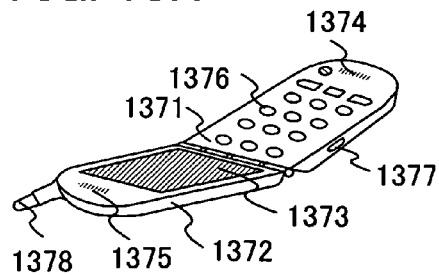
Figure 14A:
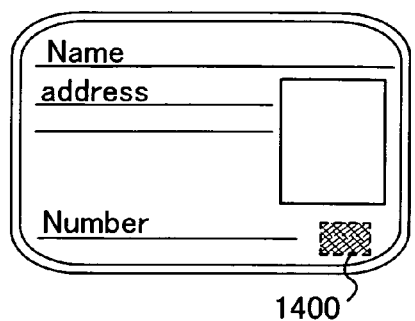
FIGS. 14A to 14F are diagrams showing uses of semiconductor devices in connection with an Embodiment Mode of the present invention.
Figure 14B:
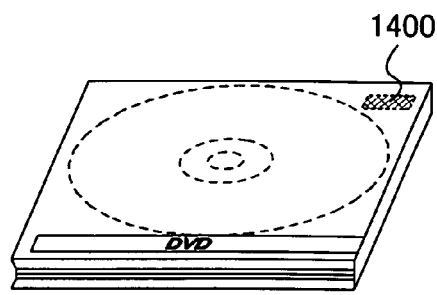
Figure 14C:
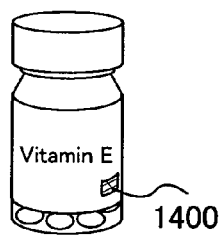
Figure 14D:
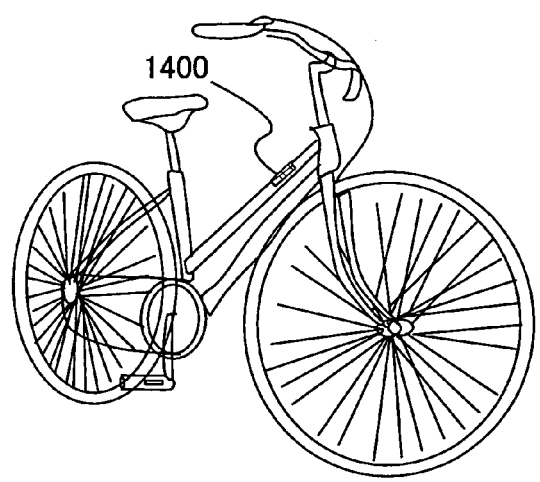
Figure 14E:
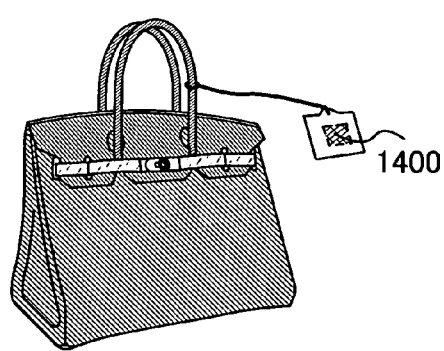
Figure 14F:
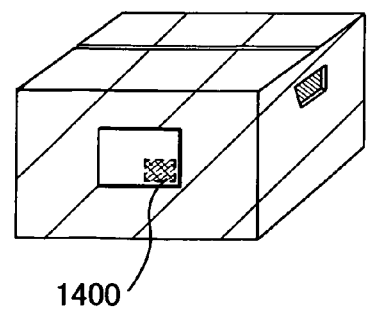

FIG. 13H is a diagram of a cellular phone that includes a main body 1371, a chassis 1372, a display 1373, an audio input 1374, an audio output 1375, operation keys 1376, an external connection port 1377, an antenna 1378, and the like. The semiconductor device of the present invention is used in the display 1373. According to the present invention, a cellular phone with excellent image quality can be provided at low cost.

As described above, the range of application of the present invention is extremely wide, and the present invention can be used in electronic devices of all fields. It is to be noted that the present embodiment mode can be used in combination with Embodiment Mode 1 through Embodiment Mode 5, as appropriate.

Embodiment Mode 7

In this embodiment mode, applications of a semiconductor device of the present invention, specifically, a wireless tag is described with reference to FIGS. 14A to 14F.

A semiconductor device functioning as a wireless tag can be formed according to the present invention. The wireless tag can be used in a wide variety of application, and may be used by being mounted on objects such as bills, coins, securities, bearer bonds, certificates (driver's licenses, resident cards, and the like, see FIG. 14A), containers for wrapping objects (wrapping paper, bottles, and the like, see FIG. 14C), recording media (DVD software, video tapes, and the like, see FIG. 14B), vehicles (bicycles and the like, see FIG. 14D), personal belongings (bags, glasses, and the like), foods, plants, clothes, lifestyle goods, and products such as electronic devices, or shipping tags of baggage (see FIGS. 14E and 14F). Note that the wireless tag is indicated by reference numeral 1400 in each of FIGS. 14A to 14F.

Note that the electronic device indicates a liquid crystal display device, an EL display device, a television unit (also simply referred to as a TV, a TV receiver, or a television receiver), a cellular phone, and the objects shown in Embodiment Mode 5, for example. In addition, the above-described semiconductor device can be used for animals, human bodies, or the like.

The wireless tag is attached to a surface of an object, or embedded to be fixed on an object. For example, the wireless tag may be incorporated in paper of a book, or an organic resin of a container for wrapping an object to be fixed on each object. By providing an RFID tag in bills, coins, securities, bearer bonds, certificates, and the like, forgery can be prevented. Further, by providing an RFID tag in containers for wrapping objects, recording media, personal belongings, foods, clothes, lifestyle goods, electronic devices, and the like, inspection systems, rental systems and the like can be performed more efficiently. The wireless tag which can be manufactured according to the present invention has high performance and reliability, and can be applied to various objects.

When a wireless tag that can be formed according to the present invention is applied to a management system or a distribution system of articles, the system can have high functionality. For example, information which is recorded in a wireless tag provided in a tag is read by a reader/writer provided near a conveyor belt, then information about a distribution process or a delivery destination is read out, and inspection of merchandise or distribution of goods can be easily carried out.

As described, the present invention can be widely applied to and used in various objects. This embodiment mode can be combined with Embodiment Modes 1 to 6 as appropriate.

Embodiment 1

In this embodiment, details such as manufacturing condition of a semiconductor substrate of the present invention will be described with reference to FIGS. 15A to 15D and FIG. 16A to 16C.

First, a single crystal silicon substrate 1500 is prepared. Here, the substrate 1500 has a thickness of about 700 μm. Next, a silicon oxynitride film 1502 functioning as a protective layer is formed over the single crystal silicon substrate 1500 with a thickness of about 150 nm (see FIG. 15A). In this embodiment, the silicon oxynitride film is formed by a chemical vapor deposition (CVD) method.

Figure 15A:
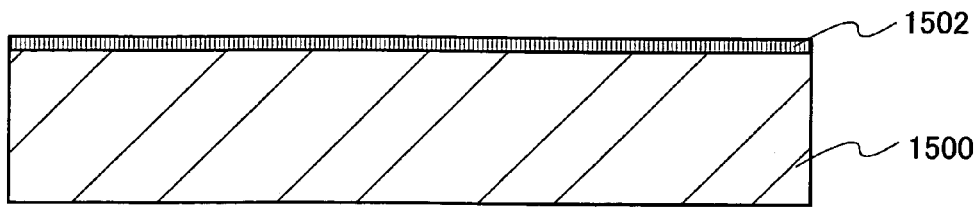
FIGS. 15A to 15D are diagrams showing a manufacturing process of a semiconductor substrate in connection with an Embodiment of the present invention.
Figure 15B:
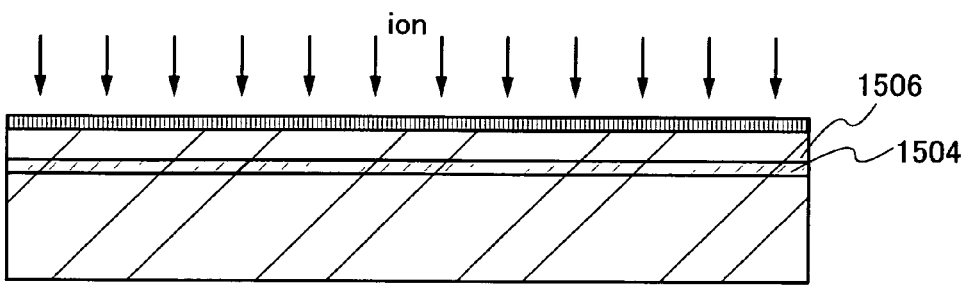

Then, the surface of the single crystal silicon substrate 1500 is irradiated with ions through the silicon oxynitride film 1502 to introduce hydrogen ions ($H^+$, $H_2^+$, $H_3^+$, and the like) in a given depth, thereby forming a damaged region 1504 and a single crystal silicon layer 1506 (see FIG. 15B). The single crystal silicon layer 1506 manufactured by ion irradiation has a thickness of about 90 nm. The ion irradiation in this embodiment is conducted using an $H_2$ gas as a material gas with an acceleration voltage of 40 kV at a dose of $2.0 \times 10^{16}$ ions/cm$^2$.

Figure 15C:
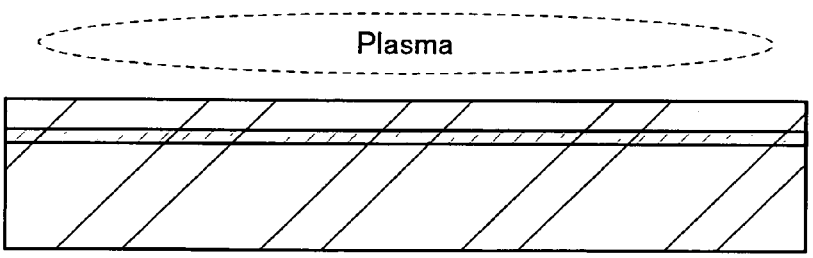
Figure 15D:
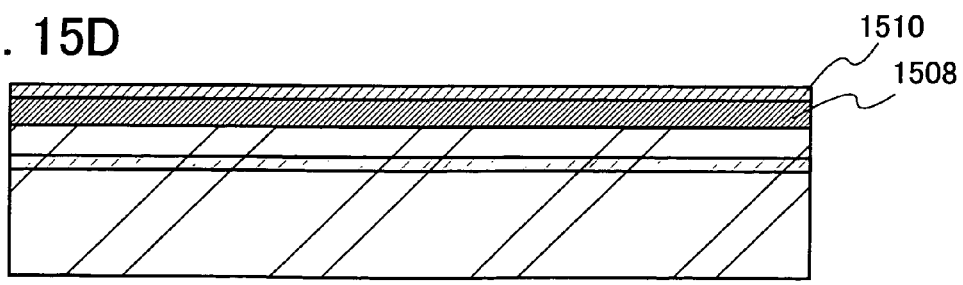

After forming the damaged region 1504, the silicon oxynitride film 1502 is removed, and plasma treatment is performed to the surface of the single crystal silicon layer 1506 (see FIG. 15C). The silicon oxynitride film 1502 is removed by wet etching using buffered hydrogen fluoride (BHF). The plasma treatment is performed under a mixed atmosphere of oxygen ($O_2$) and hydrogen ($H_2$). More specifically, plasma is generated by keeping pressure to be 40 Pa and using $O_2$ and $H_2$ at flow rates of 100 sccm and 100 sccm, and applying power of 100 W and 27.12 MHz. Note that the interval between the electrodes is about 20 mm.

A silicon oxynitride film 1508 is formed after the plasma treatment. In this embodiment, the silicon oxynitride film 1508 is formed by keeping pressure to be 40 Pa using SiH$_4$ and N$_2$O at flow rates of 4 sccm and 800 sccm, and applying power of 50 W and 27.12 Mz. Then, a silicon nitride oxide film 1510 is formed over the silicon oxynitride film 1508 (see FIG. 15D). Note that the silicon oxynitride film 1508 and the silicon nitride oxide film 1510 are formed at a temperature of 400° C. or less. Further, the silicon oxynitride film 1508 has a thickness of about 100 nm and the silicon nitride oxide film 1510 has a thickness of about 50 nm.

Subsequently, a silicon oxide film 1512 functioning as a bonding layer is formed over the silicon nitride oxide film 1510 (see FIG. 16A). In this embodiment, the silicon oxide film 1512 is formed using tetraethyl ortho silicate (TEOS, Si(OC$_2$H$_5$)$_4$) by a chemical vapor deposition (CVD) method. The film thickness of the silicon oxide film 1512 is about 50 nm.

Then, the single crystal silicon substrate 1500 and a glass substrate 1514 are disposed into contact with each other with the silicon oxide film 1512 interposed therebetween (see FIG. 16B). The glass substrate 1514 and the silicon oxide film 1512 are disposed in contact with each other and pressure is applied thereto; therefore, a strong bond can be formed.

Next, heat treatment is performed, and the single crystal silicon layer 1506 is separated from the single crystal silicon substrate 1500 using the damaged region 1504 as a separation surface (see FIG. 16C). In this embodiment, the single crystal silicon layer 1506 is separated from the single crystal silicon substrate 1500 by the heat treatment at 600° C. for two hours.

According to the above steps, the semiconductor substrate in which the silicon oxide film 1512 functioning as the bonding layer, the silicon nitride oxide film 1510, the silicon onynitride film 1508, and the single crystal silicon layer 1506 are stacked over the glass substrate 1514 is formed.

Note that this embodiment is just one example, and the present invention is not limited to this. And the condition and the like of this embodiment can be properly combined with any of Embodiment Modes 1 to 7.

This application is based on Japanese Patent Application serial no. 2007-165494 filed with Japan Patent Office on Jun. 22, 2007, the entire contents of which are hereby incorporated by reference.

What is claimed is:

1. A method for manufacturing a semiconductor substrate comprising the steps of:

forming a damaged region at a given depth from a surface of a single crystal semiconductor substrate;

performing a plasma treatment to the surface of the single crystal semiconductor substrate after forming the damaged region;

forming an insulating layer over the surface of the single crystal semiconductor substrate to which the plasma treatment is performed;

bonding a second substrate having an insulating surface to the single crystal semiconductor substrate with at least the insulating layer interposed between the second substrate and the single crystal semiconductor substrate; and performing a heat treatment to the single crystal semiconductor substrate to separate the single crystal semiconductor substrate in the damaged region and to form a single crystal semiconductor layer over the second substrate.

2. The method for manufacturing a semiconductor substrate according to claim 1, wherein the insulating layer is formed by a chemical vapor deposition method using an organic silane gas.

3. The method for manufacturing a semiconductor substrate according to claim 1 further comprising the steps of:
forming a protective film over the surface of the single crystal semiconductor substrate before forming the damaged region; and
removing the protective film after forming the damaged region.

4. The method for manufacturing a semiconductor substrate according to claim 1, wherein the plasma treatment is performed under conditions of an electron density of $1\times10^{11}$ cm$^{-3}$ to $1\times10^{13}$ cm$^{-3}$ and an electron temperature of 0.2 eV to 2.0 eV.

5. The method for manufacturing a semiconductor substrate according to claim 1, wherein the plasma treatment is performed under a hydrogen atmosphere, an oxygen atmosphere, or a mixed atmosphere of hydrogen and oxygen.

6. A method for manufacturing a semiconductor substrate comprising the steps of:
forming a damaged region at a given depth from a surface of a single crystal semiconductor substrate;
performing a plasma treatment to the surface of the single crystal semiconductor substrate after forming the damaged region;
forming a first insulating layer over the surface of the single crystal semiconductor substrate to which the plasma treatment is performed;
forming a second insulating layer over and in contact with the first insulating layer;
bonding a second substrate having an insulating surface to the single crystal semiconductor substrate with at least the first insulating layer and the second insulating layer interposed between the second substrate and the single crystal semiconductor substrate; and
performing a heat treatment to the single crystal semiconductor substrate to separate the single crystal semiconductor substrate in the damaged region and to form a single crystal semiconductor layer over the second substrate.

7. The method for manufacturing a semiconductor substrate according to claim 6, wherein the first insulating layer is formed to have a stacked-layer structure.

8. The method for manufacturing a semiconductor substrate according to claim 6, wherein the first insulating layer is formed to have a stacked-layer structure of a silicon oxynitride layer and a silicon nitride oxide layer, and the silicon oxynitride layer is formed in contact with the single crystal semiconductor substrate.

9. The method for manufacturing a semiconductor substrate according to claim 6, wherein the second insulating layer is formed by a chemical vapor deposition method using an organic silane gas.

10. The method for manufacturing a semiconductor substrate according to claim 6 further comprising the steps of:
forming a protective film over the surface of the single crystal semiconductor substrate before forming the damaged region; and
removing the protective film after forming the damaged region.

11. The method for manufacturing a semiconductor substrate according to claim 6, wherein the plasma treatment is performed under conditions of an electron density of $1\times10^{11}$ cm$^{-3}$ to $1\times10^{13}$ cm$^{-3}$ and an electron temperature of 0.2 eV to 2.0 eV.

12. The method for manufacturing a semiconductor substrate according to claim 6, wherein the plasma treatment is performed under a hydrogen atmosphere, an oxygen atmosphere, or a mixed atmosphere of hydrogen and oxygen.

* * * * *